United States Patent [19]
Schreck et al.

[11] Patent Number: 5,491,658
[45] Date of Patent: Feb. 13, 1996

[54] COLUMN DECODER FOR VIRTUAL GROUND MEMORY ARRAY

[75] Inventors: John F. Schreck; Phat C. Truong, both of Houston, Tex.

[73] Assignee: Texas Instruments Incorporated, Dallas, Tex.

[21] Appl. No.: 655,566

[22] Filed: Feb. 13, 1991

[51] Int. Cl.[6] ................................................. Q11C 16/06
[52] U.S. Cl. ........................ 365/185.16; 365/230.06; 365/185.09; 365/185.11
[58] Field of Search ......................... 365/185, 230.06, 365/231.03

[56] References Cited

U.S. PATENT DOCUMENTS

| | | | |
|---|---|---|---|
| 4,723,225 | 2/1988 | Kaszubinski et al. | 365/185 |
| 4,868,790 | 9/1989 | Wilmoth et al. | 365/185 |
| 4,878,203 | 10/1989 | Arakawa | 365/185 |
| 4,916,334 | 4/1990 | Minagawa et al. | 365/230.06 |
| 4,992,980 | 2/1991 | Park et al. | 365/185 |
| 5,020,026 | 5/1991 | Schreck et al. | 365/230.06 |
| 5,021,999 | 6/1991 | Kohda et al. | 365/185 |
| 5,022,002 | 6/1991 | Iwahashi | 365/185 |

Primary Examiner—Joseph E. Clawson, Jr.
Attorney, Agent, or Firm—Theodore D. Lindgren; W. James Brady, III; Richard L. Donaldson

[57] ABSTRACT

A virtual ground memory includes an array of rows and columns of memory cells and a plurality of alternating first and second column lines. The cells in each column are coupled to a first column line and a second column line. A first decoder selects a plurality of first column lines in response to first decoded address signals and selects one of the selected plurality of first column lines in response to second decoded address signals.

12 Claims, 32 Drawing Sheets

ADDRESS INPUT

| PRE DECODER | | | | | | | |
|---|---|---|---|---|---|---|---|
| PROGRAM PATH | | | | | | | |
| REDUNDANT ROWS | WORDLINE DECODER AND DRIVERS | R E D U N D A N T | C O L U M N S | REDUNDANT ROWS | REDUNDANT ROWS | WORDLINE DECODER AND DRIVERS | REDUNDANT ROWS |
| 512x512 MEMORY CELL ARRAY | | | | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | R E D U N D A N T | C O L U M N S | 512x512 MEMORY CELL ARRAY | 512x512 MEMORY CELL ARRAY | WORDLINE DECODER AND DRIVERS | 512x512 MEMORY CELL ARRAY |
| 512x512 MEMORY CELL ARRAY | | R E D U N D A N T | C O L U M N S | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | R E D U N D A N T | C O L U M N S | 512x512 MEMORY CELL ARRAY | 512x512 MEMORY CELL ARRAY | WORDLINE DECODER AND DRIVERS | 512x512 MEMORY CELL ARRAY |
| VIRTUAL GROUND DECODER | COLUMN DECODER | | | VIRTUAL GROUND DECODER | VIRTUAL GROUND DECODER | COLUMN DECODER | VIRTUAL GROUND DECODER |
| SENSE AMPS | | | | SENSE AMPS | SENSE AMPS | | SENSE AMPS |

DATA INPUT/OUTPUT

*FIG. 1*

COLUMN DECODER FOR VIRTUAL GROUND MEMORY ARRAY

CROSS-REFERENCE TO RELATED APPLICATIONS

The following coassigned patent applications are hereby incorporated herein by reference:

| Serial No. | Filing Date |
|------------|-------------|
| 07/594,531 | 10/9/90 |
| 07/631,606 | 12/21/90 |

FIELD OF THE INVENTION

This invention generally relates to decoding circuitry for integrated circuit memory devices. More particularly, this invention relates to a column decoder for a virtual ground nonvolatile memory device.

BACKGROUND OF THE INVENTION

Without limiting the scope of the invention, its background is described in connection with an electrically-programmable read-only-memory (EPROM), as an example.

There is a continuing demand for increased bit density in integrated circuit memory devices, such as EPROMs. One technique for increasing bit density in EPROMs is the use of a virtual ground configuration. A virtual ground configuration provides an increase in bit density over dedicated ground configurations by eliminating the need for a separate ground line for each column.

Virtual ground arrays are constructed from rows of memory cells with common gates called wordlines. Common drain diffusions form drain column lines or bitlines. Common source diffusions form source column lines or array source lines. In EPROM arrays bits are programmed by placing a high voltage on a selected bitline and word line and connecting a selected array source line to ground or by placing a high voltage on a selected array source line and wordline and connecting a selected bitline to ground. The floating gate of a programmed memory cell is charged with electrons, and the electrons in turn render the source-drain path under the charged floating gate nonconductive when a chosen wordline select voltage is applied to the control gate. The nonconductive state is read as a "zero" bit. The floating gate of a non-programmed cell is neutrally charged such that the source-drain path under the non-programmed floating gate is conductive when the same chosen wordline select voltage is applied to the control gate. The conductive state is read as a "one" bit. For an EPROM virtual ground array it is important that one array section, bounded by outermost columns have only one ground path between the high voltage bitline and the grounded array source line to avoid inadvertent programming. Since EPROMs usually program data in bytes, previous virtual ground arrays have divided the entire column width into smaller sections to eliminate extra ground paths created by programming more than one bit. Typically, the size of the smaller sections are sixteen columns wide with either eight bitlines and nine array source lines or nine bitlines and eight array source lines. However, it is often desirable to couple more than sixteen columns to an input/output device. Previous techniques to couple 64 columns to an input/output device have used four separate sixteen column sections with each section coupled to a first level 1 of 16 decoder and each 1 of 16 decoder coupled to a second level 1 of 4 decoder. The use of four separate sixteen column sections is area consuming since the sections must be spaced apart and require a total of 3 more source or drain diffusions than required in a single 64 column section. However, the area penalty using four sixteen column sections is less than the penalty incurred using a 1 of 64 decoder to decode a single 64 column section.

SUMMARY OF THE INVENTION

Generally, and in one form of the invention, a virtual ground memory includes an array of rows and columns of memory cells and a plurality of alternating first and second column lines. The cells in each column are coupled to a first column line and a second column line. A first decoder selects a plurality of first column lines in response to first decoded address signals and selects one of the selected plurality of first column lines in response to second decoded address signals.

An advantage of the invention is an increase in bit density in a memory device as a result of using two level column decoding in array sections having a large number of columns.

BRIEF DESCRIPTION OF THE DRAWINGS

In the drawings:

FIG. 1 is a block diagram of a four megabit EPROM in which the present invention may be used;

DETAILED DESCRIPTION OF PREFERRED EMBODIMENTS

Referring to FIG. 1, an example of an integrated circuit layout for a nominal four megabit EPROM is illustrated. The layout, in which dimensional proportions are not those of actual manufacture, illustrates sixteen 512 by 512 memory sub-arrays with redundant rows and columns used to replace rows and columns having defective cells. Peripheral circuitry, including row decoders, column decoders, virtual-ground decoders, wordline drivers, and column/segment pass gates, functions to connect reading and programming voltages to the rows and columns of cells in response to address inputs routed through a pre-decoder and program path. Data is written into the memory arrays during programming operations. During reading operations, data from the memory arrays is routed through sense amplifiers to the output.

Figure 2:
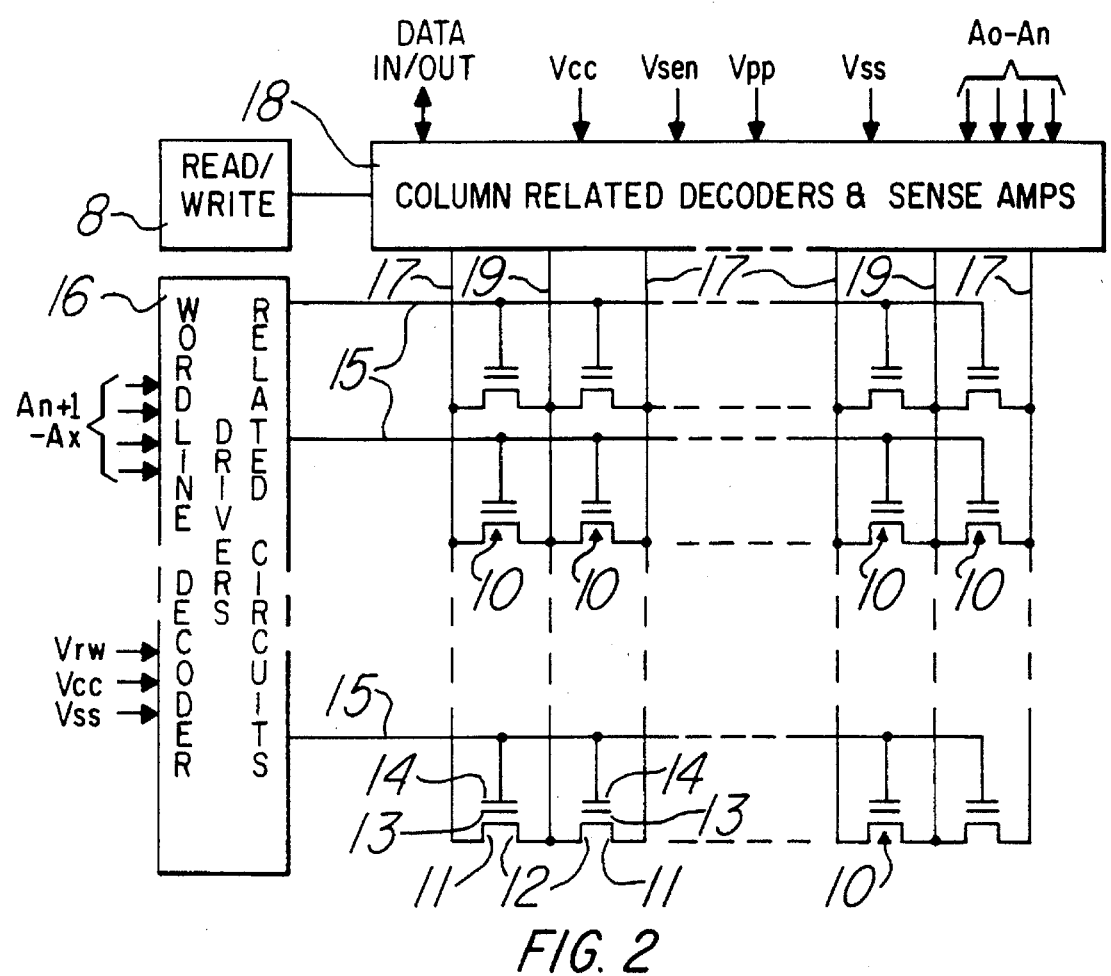
FIG. 2 is a block diagram of a part of a memory cell array and associated circuitry of the EPROM of FIG. 1.

Referring to FIG. 2, an example array of memory cells, which is a part of a memory chip such as that illustrated in FIG. 1, is shown. Each cell 10 is a floating gate transistor having a source 11, a drain 12, a floating gate 13 and a control gate 14. Each of the control gates 14 in a row of cells 10 is connected to a wordline 15, and each of the wordlines 15 is connected to a row decoder circuit 16. Each of the sources 11 in a column of cells 10 is connected to a source-column line or array source line 17, and each of the source-column lines 17 is connected to a column decoder circuit 18. Each of the drains 12 in a column of cells 10 is connected to a drain-column line or bitline 19, and each of the drain-column lines 19 is connected to the column decoder circuit 18.

In a write or program mode, row decoder circuit 16, in response to wordline address signals 20r and to signals from read/write control circuit 8, places a first preselected programming voltage Vpp (approximately +12.5 volts) on a selected wordline 15, including a control gate 14 of a selected memory cell 10. Deselected wordlines 15 are connected to reference potential Vss. Column decoder circuit 18, in response to bitline address signals 20d and to signals from read/write control circuit 8, places a second programming voltage Vrw (which may be Vpp reduced through an impedance to approximately +5 to +10 volts) on a selected source-column line 17 and, therefore, the source region 11 of the selected cell 10. Column decoder circuit 18 also connects a selected drain-column line 19 to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 volts to −6 volts with respect to the channel region. The injected electrons and negative program charge in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

Erasing of cells may be accomplished, for example, by ultraviolet radiation.

In the read mode, row decoder circuit 16, in response to wordline address signals 20r and to signals from read/write control circuit 8, applies a preselected positive voltage Vcc (approximately +volts to +5 volts) to the selected wordline 15 and thus to the selected control gate 14, and applies a low voltage (ground or Vss) to deselected wordlines 15. The column decoder circuit 18, in response to column address signals 20d and to signals from read/write control circuit 8, applies a positive voltage Vsen (approximately +1 volt to +1.5 volts) to the selected drain-column line 19. Deselected drain-column lines 19 are floated. Column decoder circuit 18 also connects all of the source-column lines 17 to ground or reference potential Vss except for the source-column line 17 sharing the same drain-column line connected to the cell 10 that is being read. That source-column line 17 is driven to the same voltage level as the selected drain-column line 19.

As is well known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are interchangeable for each mode of operation.

Figure 3:
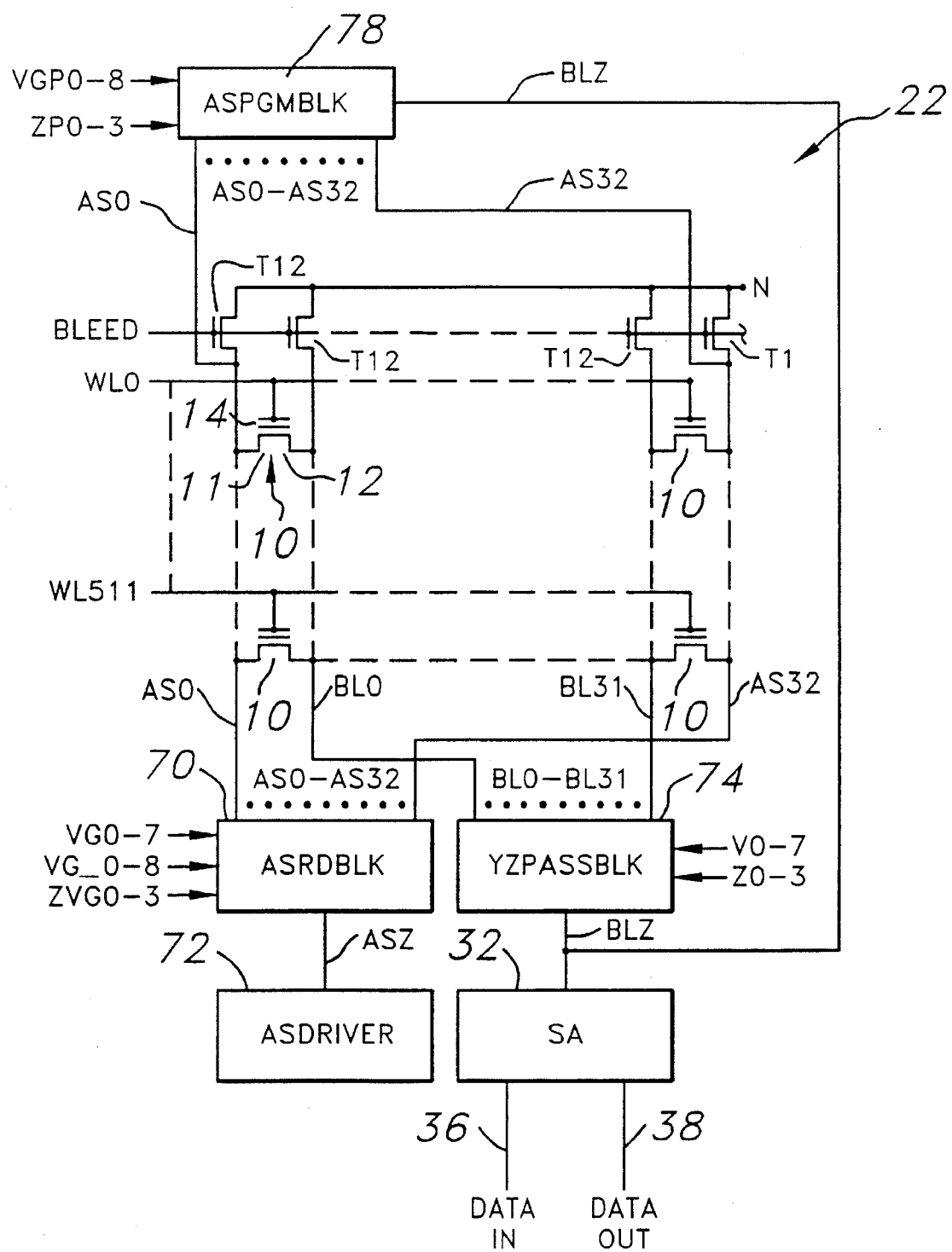
FIG. 3 is a block diagram of a portion a subarray and associated column decoding circuitry of FIG. 1.

FIG. 3 is a block diagram showing a subarray portion 22 and associated column decoding circuits. Each of the 512 row by 512 column subarrays shown in FIG. 1 is divided into eight 512 row by 64 column memory cell subarrays 22. Subarray portion 22 has 64 columns (column 0–column 63) and 512 rows (row 0–row 511) of cells 10. The control gate 14 of each cell 10 in a row is coupled to an associated one of wordlines WL0–WL511. The drain 12 of each cell 10 in a column is coupled to an associated one of drain column lines or bitlines BL0–BL31. Adjacent columns of cells share a common bitline BL. For example, column 0 and column 1 share bitline BL0, column 1 and column 2 share bitline BL1, ..., and columns 62 and 63 share bitline BL31.

The source 11 of each cell 10 in a column is coupled to an associated one of source column lines or array source lines AS0–AS32. Adjacent ones of columns 1–62 share a common source column line AS. For example, column 1 and column 2 share source column line AS1, column 2 and column 3 share source column line AS2, ..., and column 61 and column 62 share source column line AS31. Outermost columns 0 and 63 have dedicated source column lines AS0 and AS32, respectively.

Source column lines AS0–AS32 and drain column lines BL0–BL31 are coupled to a common node N by transistors T12. Transistors T12 have gates connected to a BLEED terminal and operate as described in Ser. No. 07/631,606, filed Dec. 21, 1990 to provide a discharge path for source column lines AS0–AS32 and drain column lines BL0–BL31.

Source column lines AS0–AS32 leaving the bottom of subarray portion 22 are coupled to source column read block circuit 70. Drain column lines BL0–BL31 leaving the bottom of subarray portion 22 are coupled to YZ pass block circuit 74. Source column lines AS0–AS32 leaving the top of subarray portion 22 are coupled to source column program block 78. As will be described in detail below, source column read-select block 70, YZ pass block circuit 74, and source column program-select block circuit 78 perform two level decoding of the 64 columns in array portion 22.

During reading of a selected cell 10, the selected drain column line BL is coupled by YZ pass block circuit 74 to line BLZ in response to decoded address signals Y0–Y7 and Z0–Z3. Sense amplifier/program circuit 32 biases line BLZ and the selected drain column line BL to Vsen (approximately +1 to +1.5 volts). A suitable sense amplifier/program circuit 32 is described in application Ser. No. 07/594,531, filed Oct. 10, 1990. Deselected drain column lines BL are connected to node N through transistors T12. Source column read block circuit 70 couples the selected source column line to Vss or ground in response to decoded address signals VG0–VG7, VG_0–VG_8, and ZVG0–ZVG3. Source column read block circuit 70 also couples all deselected source column lines AS to Vss or ground with the exception of the source column line connected to the deselected cell 10 that both shares the selected drain column line BL and is connected to the same wordline WL. That source column line is coupled by source column read block circuit 70 to line ASZ. Source column driver circuit 72 biases line ASZ and the source column line AS coupled to line ASZ to a voltage equal to Vsen (approximately +1 to +1.5 volts). A suitable source column driver circuit 72 is described in application Ser. No. 07/631,606, filed Dec. 21, 1990.

For example, if the selected cell 10 to be read is in column 0, selected drain column line BL0 is coupled to BLZ by YZ pass block circuit 74 and biased to Vsen by sense amplifier/program circuit 32. Selected source column line AS0 and deselected source column lines AS2–32 are coupled to Vss or ground. Deselected source column line AS1 is coupled by source column read block circuit 70 to ASZ and biased to a voltage equal to Vsen by source column driver circuit 72.

In the program mode, the selected drain column line BL is coupled by YZ pass block circuit 74 to line BLZ in response to decoded address signals Y0–Y7 and Z0–Z3. If the input data on line 36 has a logic "0" value, sense amplifier/program circuit 32 biases line BLZ and the selected drain column line BL to Vss or ground. Source column program block 78 biases the selected source column line AS to Vrw (Vpp reduced through an impedance to approximately +5 to +10 volts) in response to decoded address signals VGP0–VGP8 and ZP0–ZP3 and Vss on line BLZ. With Vpp on the selected wordline, the selected cell is programmed to store a "0" value. If the input data on line 36 has a logic "1" value, sense amplifier/program circuit 32 biases line BLZ and the selected drain column line BL to Vcc (approximately +to +5 volts). The selected source column line AS is coupled only to node N with Vcc on line BLZ. Deselected drain column lines BL are connected to node N through transistors T12 irrespective of the value of the input data.

Figure 4:
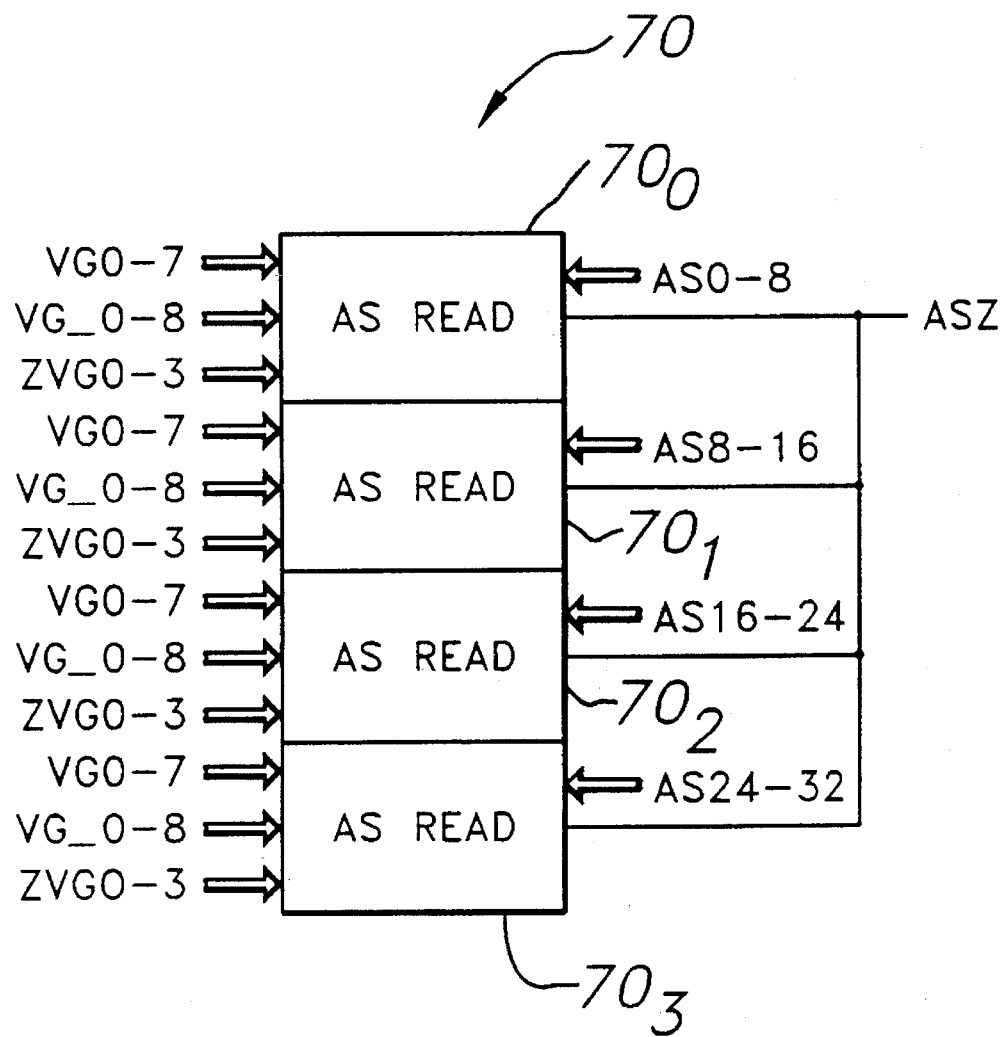
FIG. 4 is a block diagram of the source column read block of FIG. 3.

FIG. 4 shows source column read-select block circuit 70 in greater detail. Source column read-select block circuit 70 includes four source column read-select circuits $70_0$–$70_3$. Source column read circuit $70_0$ is coupled to source column lines AS0–AS8 and, in conjunction with Y decoding by YZ pass block circuit 74, performs 1 of 16 decoding of columns 0–15 by selecting the source column line AS of one of those columns in response to decoded address signals VG0–VG7 and VG_0–VG_8. Source column read circuit $70_1$ is coupled to source column lines AS8–AS16 and, in conjunction with Y decoding by YZ pass block circuit 74, performs 1 of 16 decoding of columns 16–31 by selecting the source column line AS of one of those columns in response to decoded address signals VG0–VG7 and VG_0–VG_8.

Source column read circuit $70_2$ is coupled to source column lines AS16–AS24 and, in conjunction with Y decoding by YZ pass block circuit 74, performs 1 of 16 decoding of columns 32–47 by selecting the source column line AS of one of those columns in response to decoded address signals VG0–VG7 and VG_0–VG_8. Source column read circuit $70_3$ is coupled to source column lines AS24–AS32 and, in conjunction with Y decoding by YZ pass block circuit 74, performs 1 of 16 decoding of columns 48–63 by selecting the source column line AS of one of those columns in response to decoded address signals VG0–VG7 and VG_0–VG_8.

Source column read-select circuits $70_0$–$70_3$, in conjunction with Z decoding by YZ pass block circuit 74, perform 1 of 4 decoding by coupling one of the four selected source column lines to line ASZ in response to decoded address signals ZVG0–ZVG3.

FIGS. 5a–5d are electrical schematic diagrams of source column read-select circuits $70_0$–$70_3$, respectively. In column read-select circuit $70_0$ of FIG. 5a, source column lines AS0–AS7 are connected to n-channel field effect transistors $T14_0$–$T14_7$ and to n-channel field effect transistors $T16_0$–$T16_7$, respectively, and source column line AS8 is connected to n-channel transistor $T16_8$. Transistors $T14_0$–$T14_7$ selectively couple source column lines AS0–AS7 to Vss or ground in response to decoded address signals VG0–VG7, respectively. Transistors $T16_0$–$T16_8$ selectively couple source column lines AS0–AS8 to n-channel transistors $T18_0$–$T18_3$ in response to decoded address signals VG_0–VG_8. Signals VG_0–VG_7 are the complements of signals VG0–VG7. Transistor $T18_0$ selectively couples a source column line AS0–AS8 selected by one of transistors $T16_0$–$T16_8$ to line ASZ in response to decoded address signal ZVG0. Transistors $T18_1$–$T18_3$ selectively couple a source column line AS0–AS8 selected by one of transistors $T16_0$–$T16_8$ to Vss or ground in response to decoded address signals ZVG1–ZVG3, respectively.

Figure 5A:
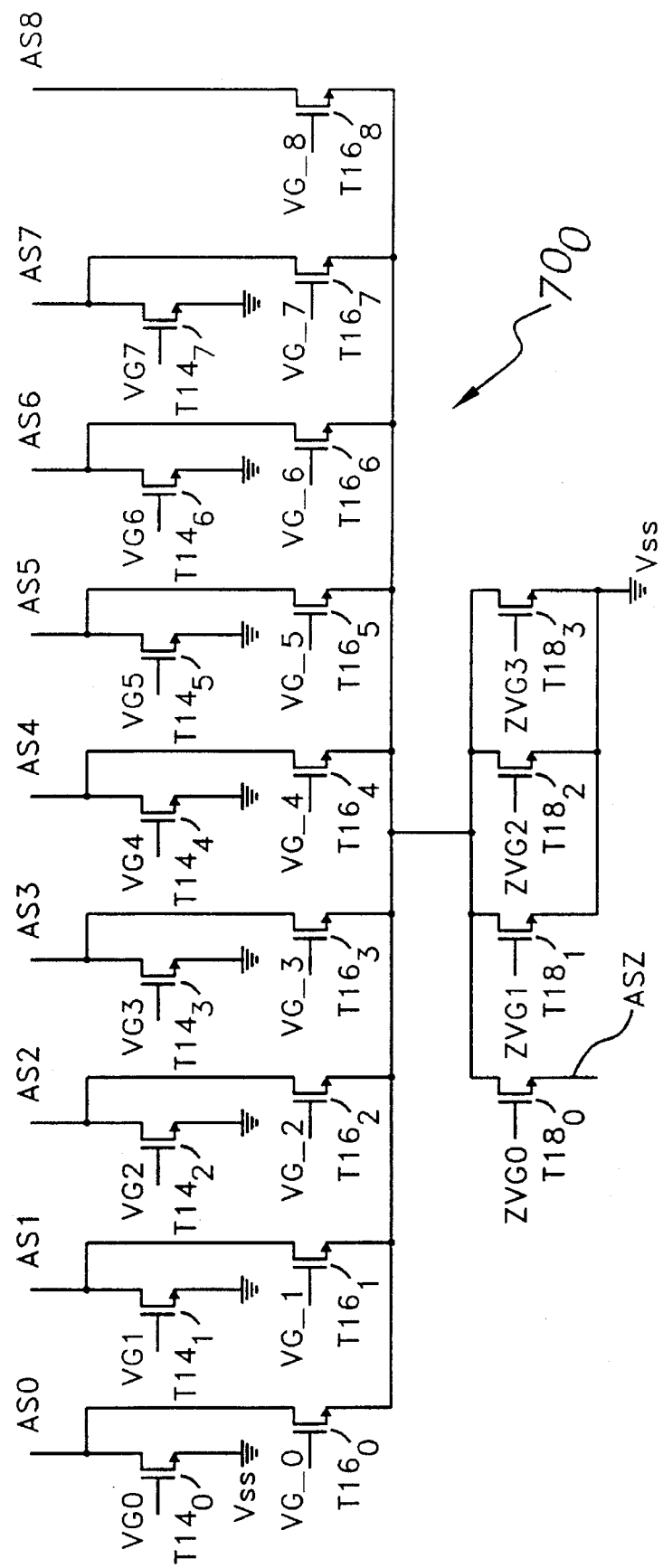
FIGS. 5a–5d are schematic diagrams of source column read circuits $70_0$–$70_3$ of FIG.4, respectively.
Figure 5B:
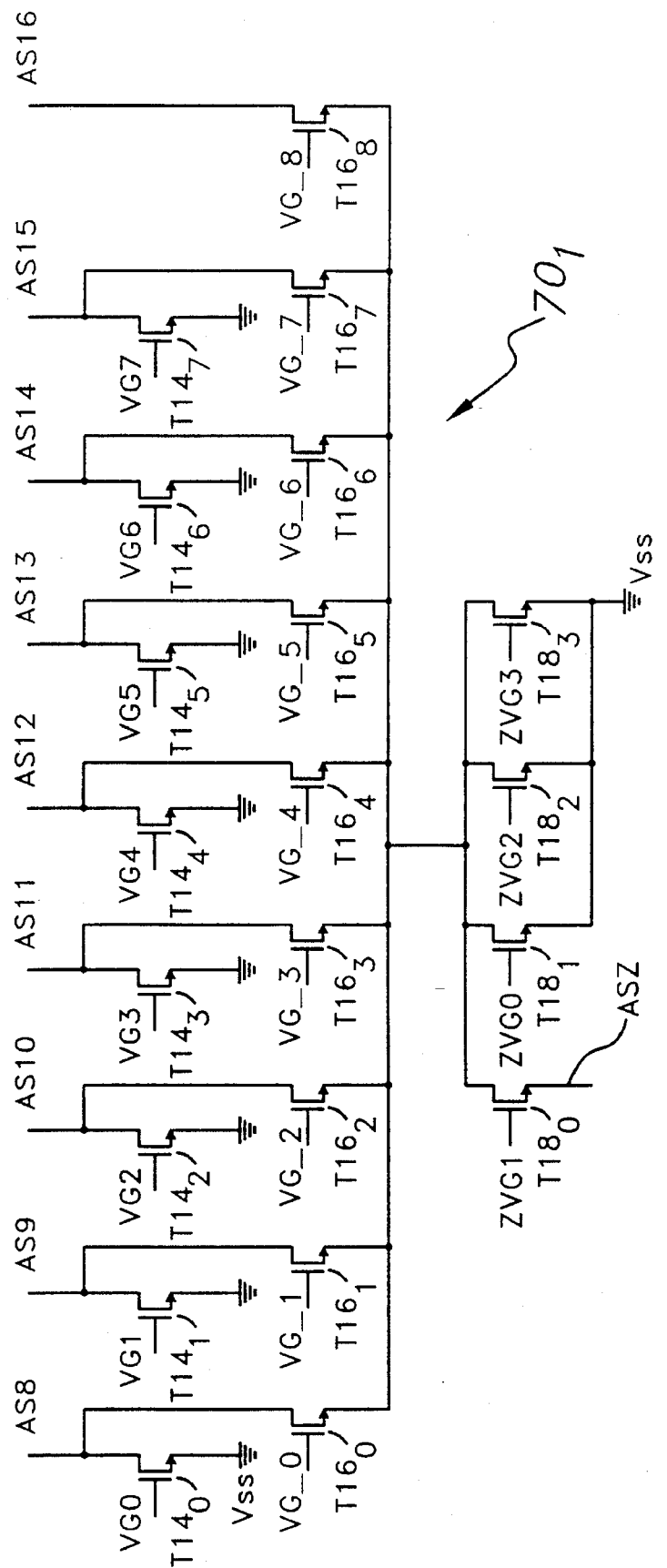

In column read-select circuit $70_1$ of FIG. 5b, source column lines AS8–AS15 are connected to n-channel field effect transistors $T14_0$–$T14_7$ and to n-channel field effect transistors $T16_0$–$T16_7$, respectively, and source column line AS16 is connected to n-channel transistor $T16_8$. Transistors $T14_0$–$T14_7$ selectively couple source column lines AS8–AS15 to Vss or ground in response to decoded address signals VG0–VG7, respectively. Transistors $T16_0$–$T16_8$ selectively couple source column lines AS8–AS16 to n-channel transistors $T18_0$–$T18_3$ in response to decoded address signals VG_0–VG_8. Transistor $T18_0$ selectively couples a source column line AS0–AS8 selected by one of transistors $T16_0$–$T16_8$ to line ASZ in response to decoded address signal ZVG1. Transistors $T18_1$–$T18_3$ selectively couple a source column line AS0–AS8 selected by one of transistors $T16_0$–$T16_8$ to Vss or ground in response to decoded address signals ZVG0, ZVG2, and ZVG3, respectively.

Figure 5C:
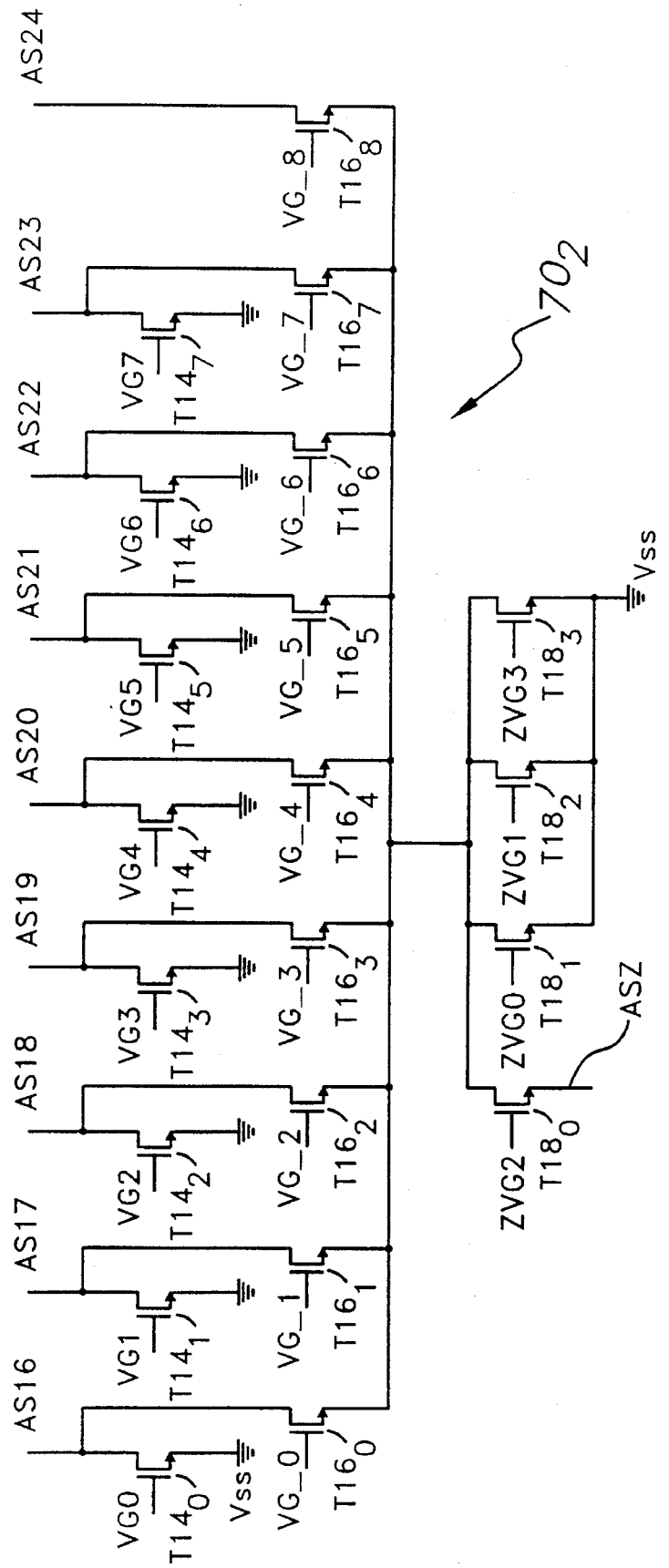
Figure 5D:
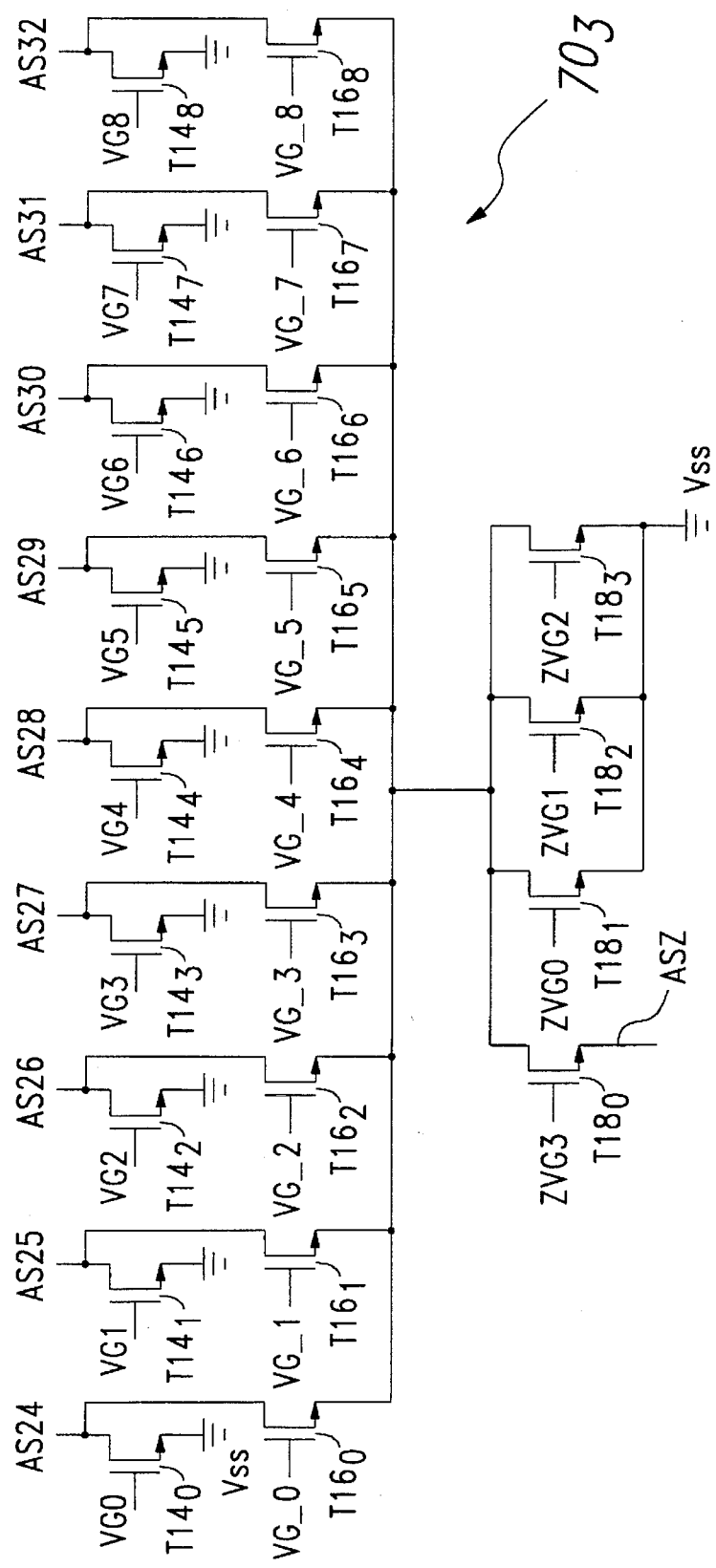

In column read-select circuit $70_2$ of FIG. 5c, source column lines AS16–AS23 are connected to n-channel field effect transistors $T14_0$–$T14_7$ and to n-channel field effect transistors $T16_0$–$T16_7$, respectively, and source column line AS24 is connected to n-channel transistor $T16_8$. Transistors $T14_0$–$T14_7$ selectively couple source column lines AS16–AS23 to Vss or ground in response to decoded address signals VG0–VG7, respectively. Transistors $T16_0$–$T16_8$ selectively couple source column lines AS16–AS24 to n-channel transistors $T18_0$–$T18_3$ in response to decoded address signals VG_0–VG_8. Transistor $T18_0$ selectively couples a source column line AS0–AS8 selected by one of transistors $T16_0$–$T16_8$ to line ASZ in response to decoded address signal ZVG2. Transistors $T18_1$–$T18_3$ selectively couple a source column line AS0–AS8 selected by one of transistors $T16_0$–$T16_8$ to Vss or ground in response to decoded address signals ZVG0, ZVG1, and ZVG3, respectively.

In column read-select circuit $70_3$ of FIG. 6d, source column lines AS24–AS32 are connected to n-channel field effect transistors $T14_0$–$T14_8$ and to n-channel field effect transistors $T16_0$–$T16_8$, respectively. Transistors $T14_0$–$T14_8$ selectively couple source column lines AS24–AS32 to Vss or ground in response to decoded address signals VG0–VG7. Transistors $T16_0$–$T16_8$ selectively couple source column lines AS8–AS16 to n-channel transistors $T18_0$–$T18_3$ in response to decoded address signals VG_0–VG_8. Transistor $T18_0$ selectively couples a source column line AS0–AS8 selected by one of transistors $T16_0$–$T16_8$ to line ASZ in response to decoded address signal ZVG3. Transistors $T18_1$–$T18_3$ selectively couple a source column line AS0–AS8 selected by one of transistors $T16_0$–$T16_8$ to Vss or ground in response to decoded address signals ZVG0, ZVG1, and ZVG2, respectively.

Figure 6:
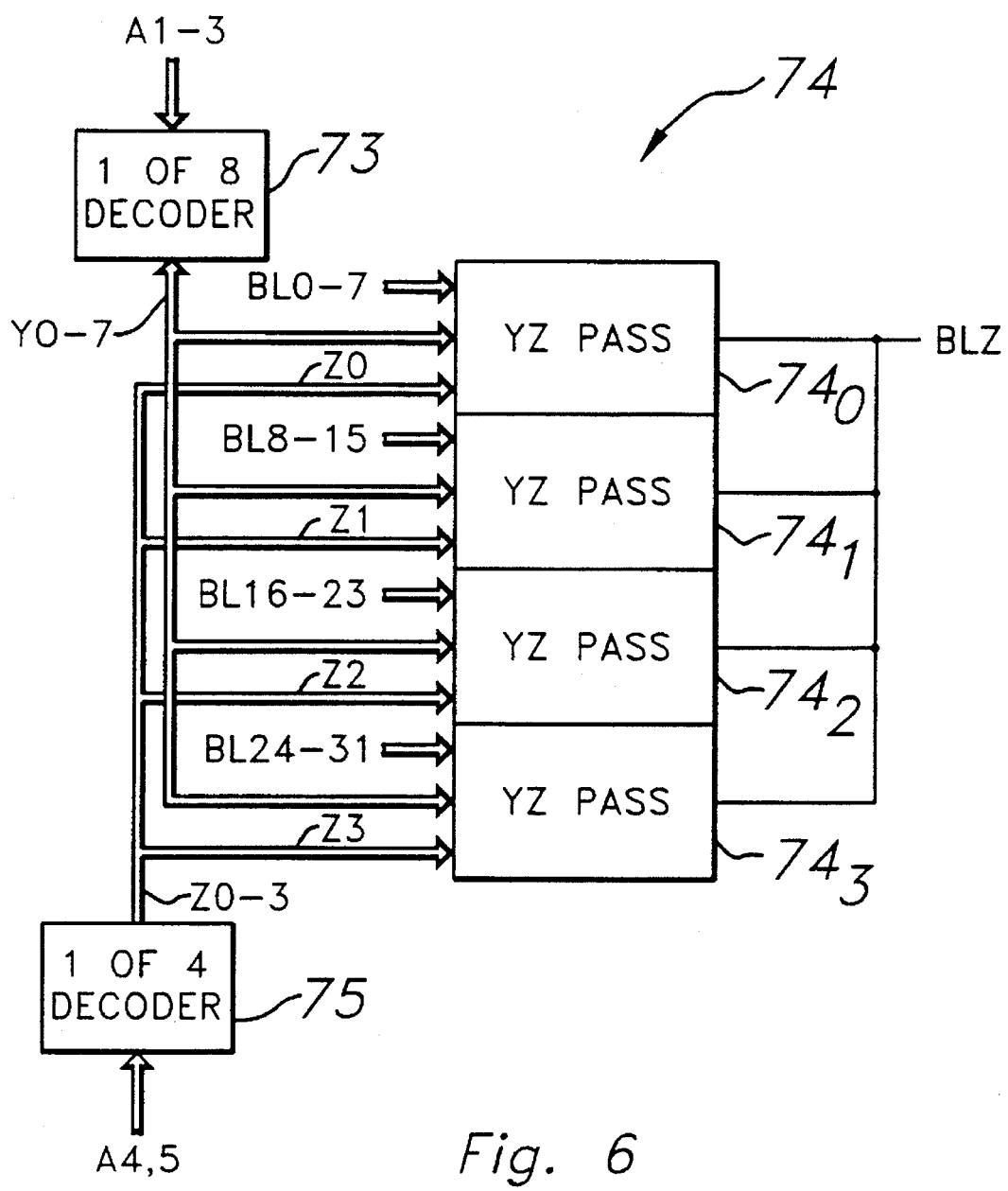
FIG. 6 is a block diagram of the YZ pass block of FIG. 3.

FIG. 6 shows YZ pass block circuit 74 in greater detail. YZ pass block circuit 74 includes four YZ pass circuits $74_0$–$74_3$. YZ pass circuit $74_0$ is coupled to bitlines BL0–BL7 and, in conjunction with decoding by source column read-select block circuit 70 or source column program block circuit 78, performs 1 of 16 decoding of columns 0–15 by selecting the bitline BL of one of those columns in response to decoded address signals Y0–Y7. YZ pass circuit $74_1$ is coupled to bitlines BL8–BL15 and, in conjunction with decoding by source column read-select block circuit 70 or source column program block circuit 78, performs 1 of 16 decoding of columns 16–31 by selecting the bitline BL of one of those columns in response to decoded address signals Y0–Y7. YZ pass circuit $74_2$ is coupled to bitlines BL16–BL23 and, in conjunction with decoding by source column read-select block circuit 70 or source column program block circuit 78, performs 1 of 16 decoding of columns 32–47 by selecting the bitline BL of one of those columns in response to decoded address signals Y0–Y7. YZ pass circuit $74_3$ is coupled to bitlines BL24–BL31 and, in conjunction with decoding by source column read-select block circuit 70 or source column program block circuit 78, performs 1 of 16 decoding of columns 48–63 by selecting the bitline BL of one of those columns in response to decoded address signals Y0–Y7.

YZ pass circuits $74_0$–$74_3$, in conjunction with decoding by source column read-select block circuit 70 or source column program block circuit 78, perform 1 of 4 decoding by coupling one of the four selected bitlines to line BLZ in response to decoded address signals Z0–Z3. Signals Y0–Y7 are produced by 1 of 8 decoder 73 in response to address signals A0–A3. Signals Z0–Z3 are produced by 1 of 4 decoder 75 in response to address signals A4 and A5.

FIGS. 7a–7d are electrical schematic diagrams of YZ pass circuits $74_0$–$74_3$, respectively. In YZ pass circuit $74_0$ of FIG. 7a, bitlines BL0–BL7 are connected to n-channel field effect transistors $T20_0$–$T20_7$, respectively. Transistors $T20_0$–$T20_7$ selectively couple bitlines BL0–BL7 to n-channel transistor T22 in response to decoded address signals Y0–Y7. Transistor T22 selectively couples a bitline BL0–BL7 selected by one of transistors $T20_0$–$T20_7$ to line BLZ in response to decoded address signal Z0. In YZ pass circuit $74_1$ of FIG. 7b, bitlines BL8–BL15 are connected to n-channel field effect transistors $T20_0$–$T20_7$, respectively. Transistors $T20_0$–$T20_7$ selectively couple bitlines BL8–BL15 to n-channel transistor T22 in response to decoded address signals Y0–Y7. Transistor T22 selectively couples a bitline BL0–BL7 selected by one of transistors $T20_0$–$T20_7$ to line BLZ in response to decoded address signal Z1.

Figure 7A:
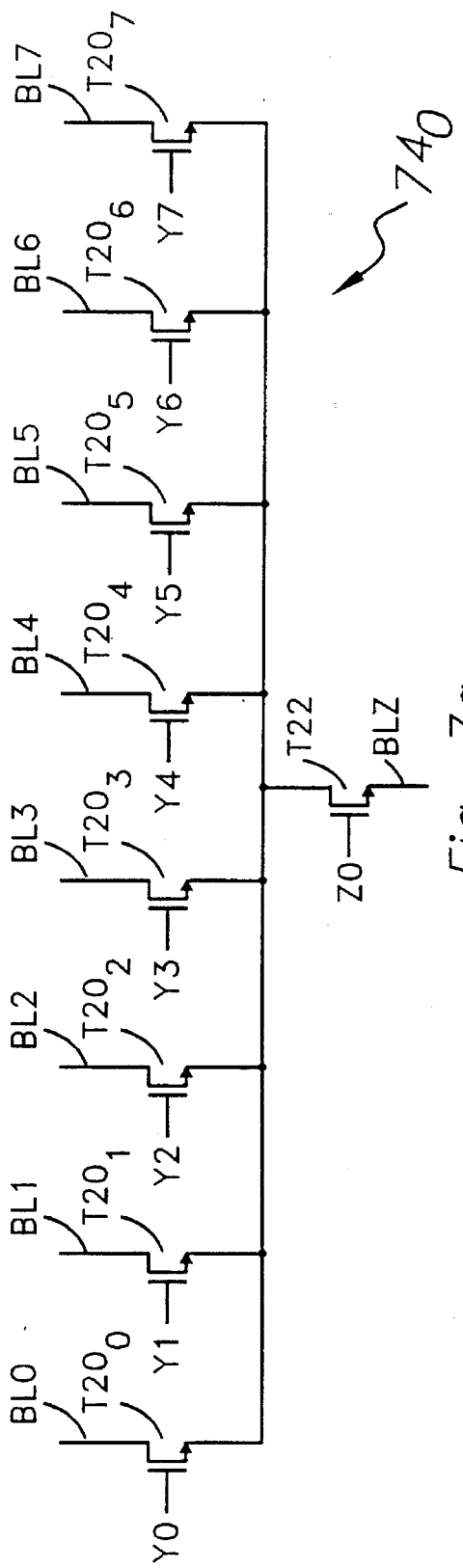
FIGS. 7a–7c are schematic diagrams of YZ pass circuits $74_0$–$74_3$ of FIG. 6.
Figure 7B:
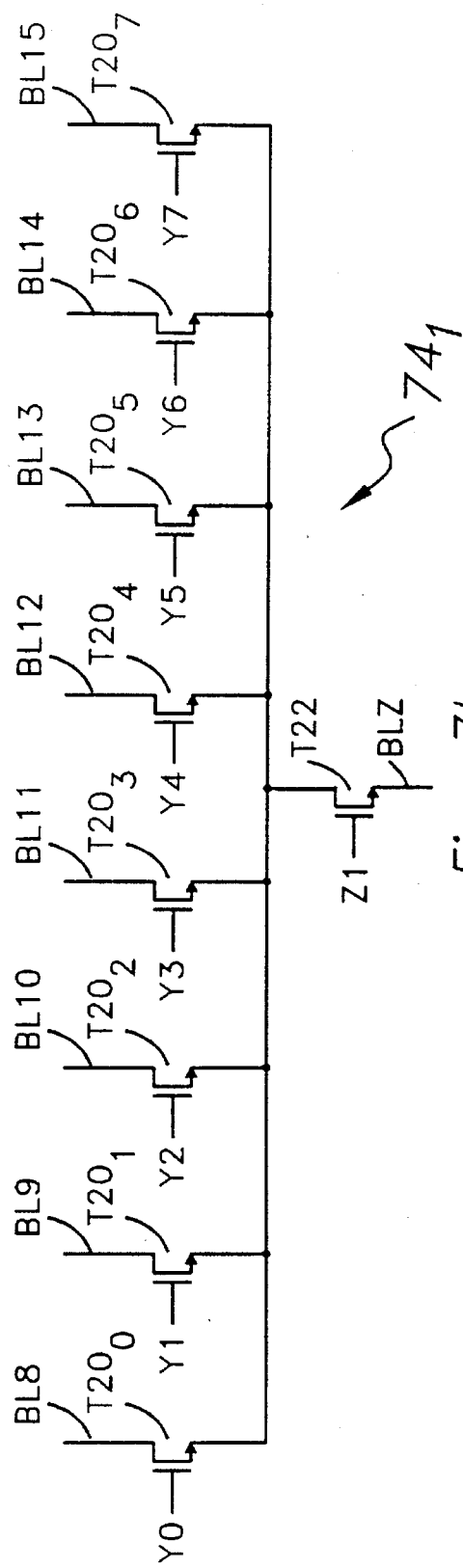
Figure 7C:
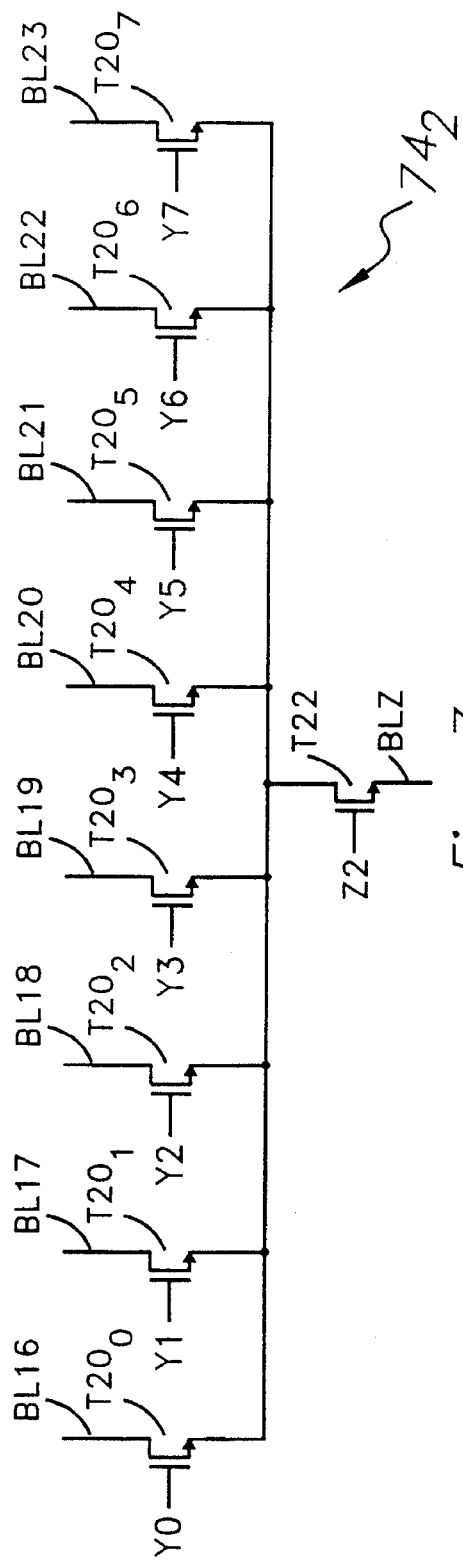
Figure 7D:
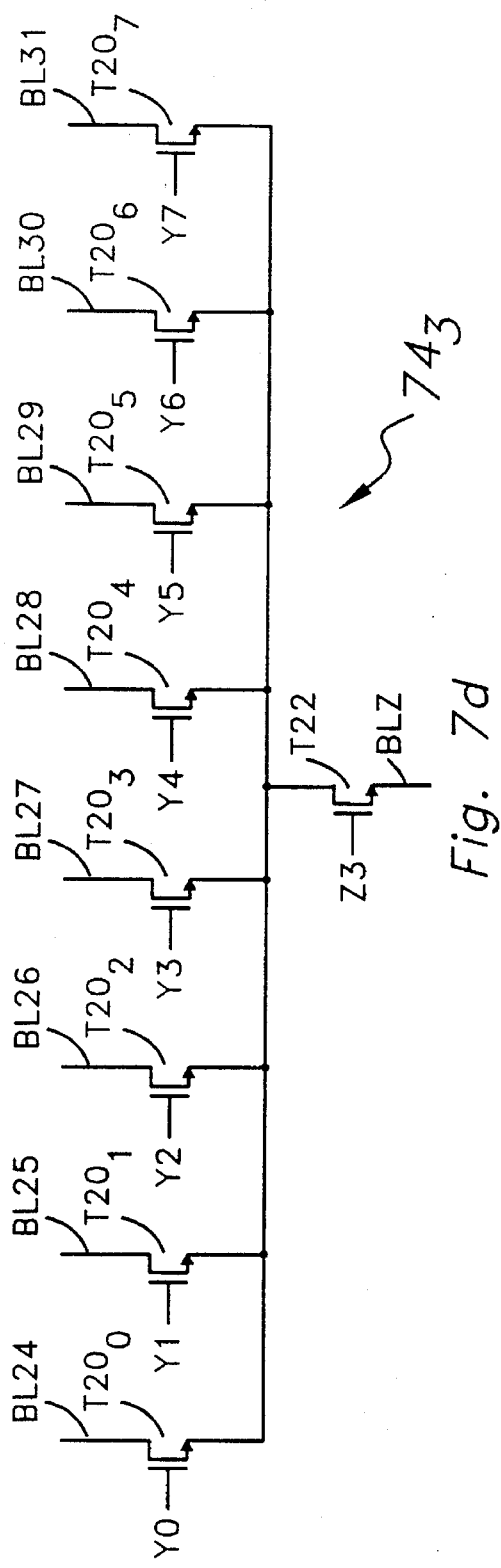

In YZ pass circuit 742 of FIG. 7c, bitlines BL16–BL23 are connected to n-channel field effect transistors $T20_0$–$T20_7$, respectively. Transistors $T20_0$–$T20_7$ selectively couple bitlines BL16–BL23 to n-channel transistor T22 in response to decoded address signals Y0–Y7. Transistor T22 selectively couples a bitline BL16–BL23 selected by one of transistors $T20_0$–$T20_7$ to line BLZ in response to decoded address signal Z2. In YZ pass circuit 743 of FIG. 7d, bitlines BL24–BL31 are connected to n-channel field effect transistors $T20_0$–$T20_7$, respectively. Transistors $T20_0$–$T20_7$ selectively couple bitlines BL24–BL31 to n-channel transistor T22 in response to decoded address signals Y0–Y7. Transistor T22 selectively couples a bitline BL24–BL31 selected by one of transistors $T20_0$–$T20_7$ to line BLZ in response to decoded address signal Z3.

Figure 8:
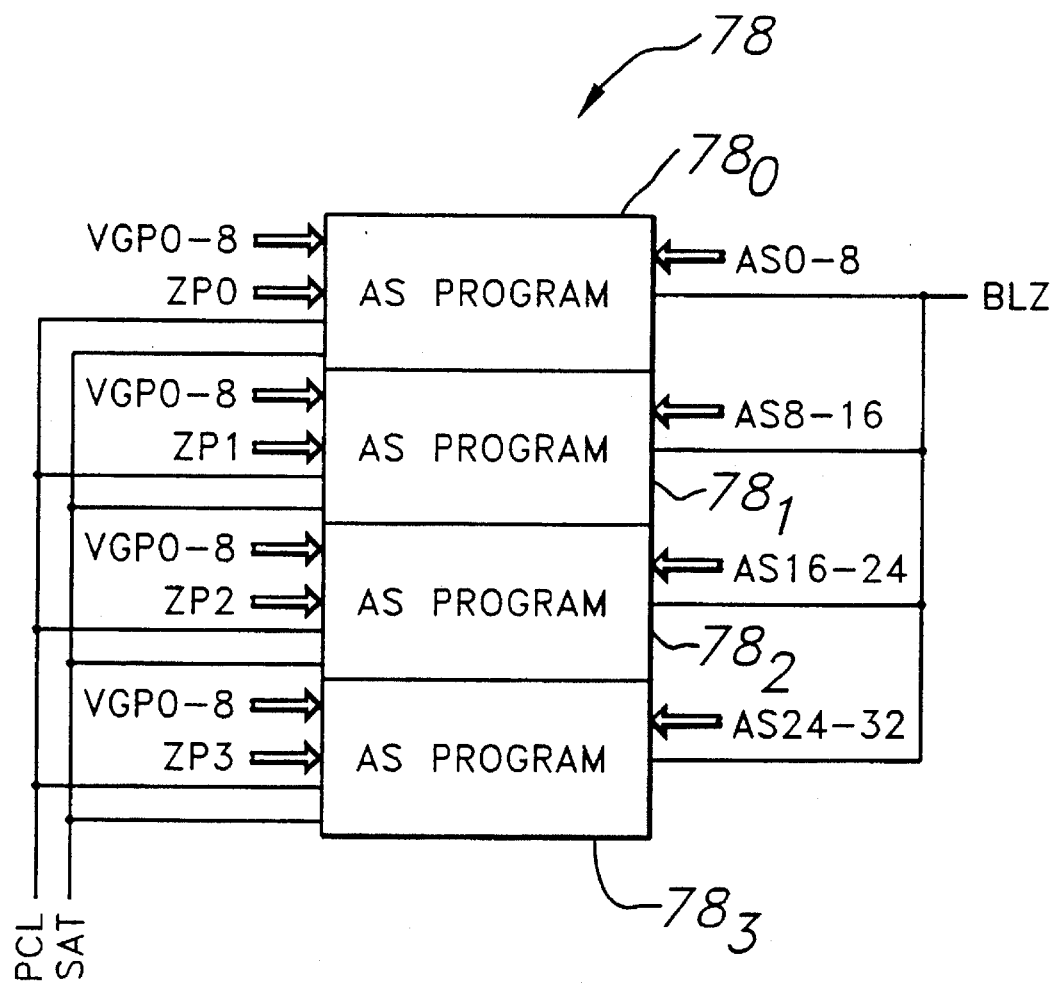
FIG. 8 is a block diagram of the source column program block of FIG. 3.

FIG. 8 shows source column program block circuit 78 in greater detail. Source column program block circuit 78 includes four source column program circuits $78_0$–$78_3$. Source column program circuit $78_0$ is coupled to source column lines AS0–AS8 and, in conjunction with Y decoding by YZ pass block circuit 74, performs 1 of 16 decoding of columns 0–15 by selecting the source column line AS of one of those columns in response to decoded address signals VGP0–VGPS. Source column program circuit $78_1$ is coupled to source column lines AS8–AS16 and, in conjunction with Y decoding by YZ pass block circuit 74, performs 1 of 16 decoding of columns 16–31 by selecting the source column line AS of one of those columns in response to decoded address signals VGP0–VGP8.

Source column program circuit $78_2$ is coupled to source column lines AS16–AS24 and, in conjunction with Y decoding by YZ pass block circuit 74, performs 1 of 16 decoding of columns 32–47 by selecting the source column line AS of one of those columns in response to decoded address signals VGP0–VGP8. Source column program circuit $78_3$ is coupled to source column lines AS24–AS32 and, in conjunction with Y decoding by YZ pass block circuit 74, performs 1 of 16 decoding of columns 48–63 by selecting the source column line AS of one of those columns in response to decoded address signals VGP0–VGP8.

Source column program circuits $78_0$–$78_3$, in conjunction with Z decoding by YZ pass block circuit 74, perform 1 of 4 decoding by coupling BLZ to bias circuitry in one of source column program circuits $78_0$–$78_3$ to bias one of the four selected source column lines AS in response to decoded address signals ZP0–ZP3.

Figure 9A:
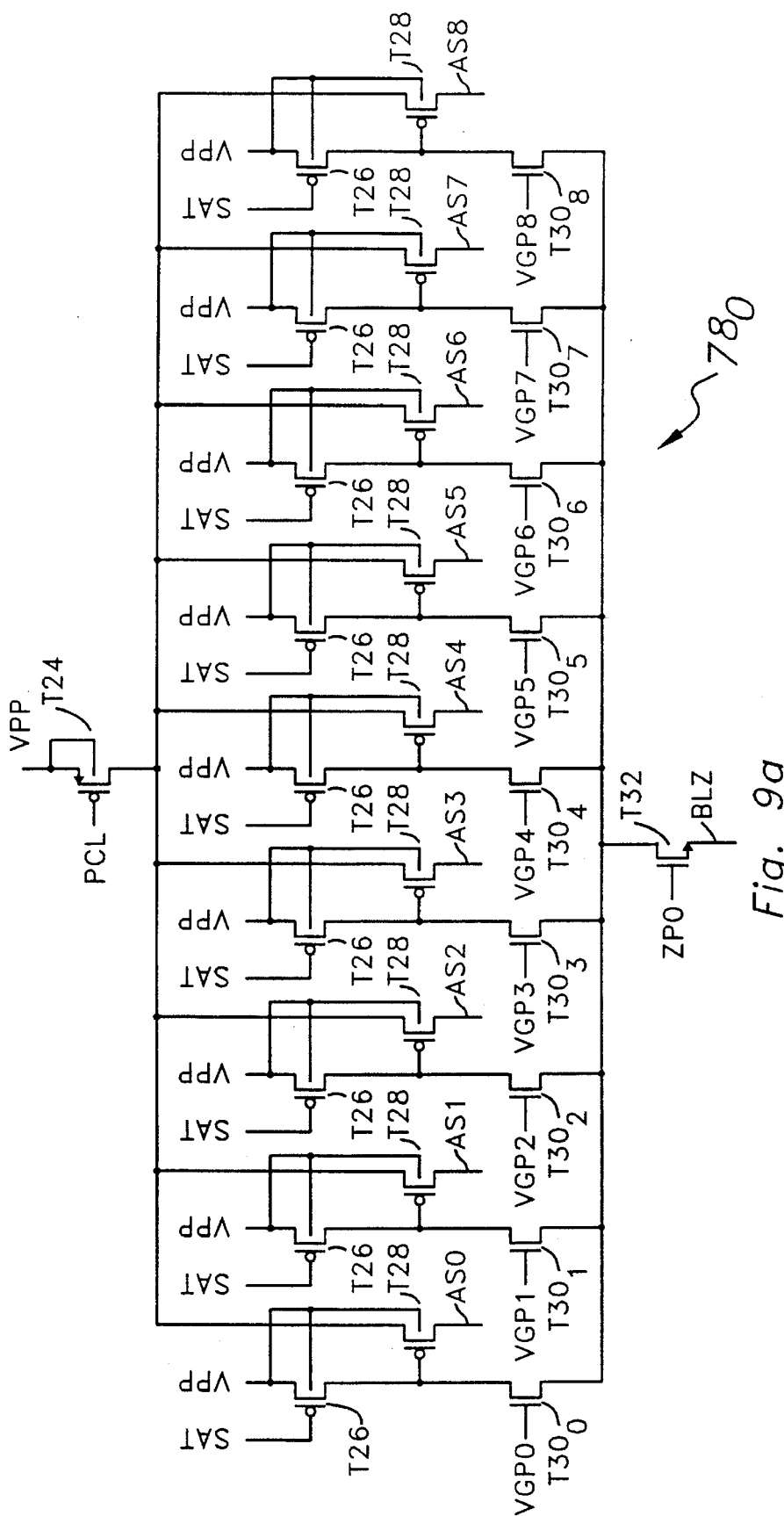
FIGS. 9a–9d are schematic diagrams of source column program circuits $78_0$–$78_3$ of FIG. 8.
Figure 9B:
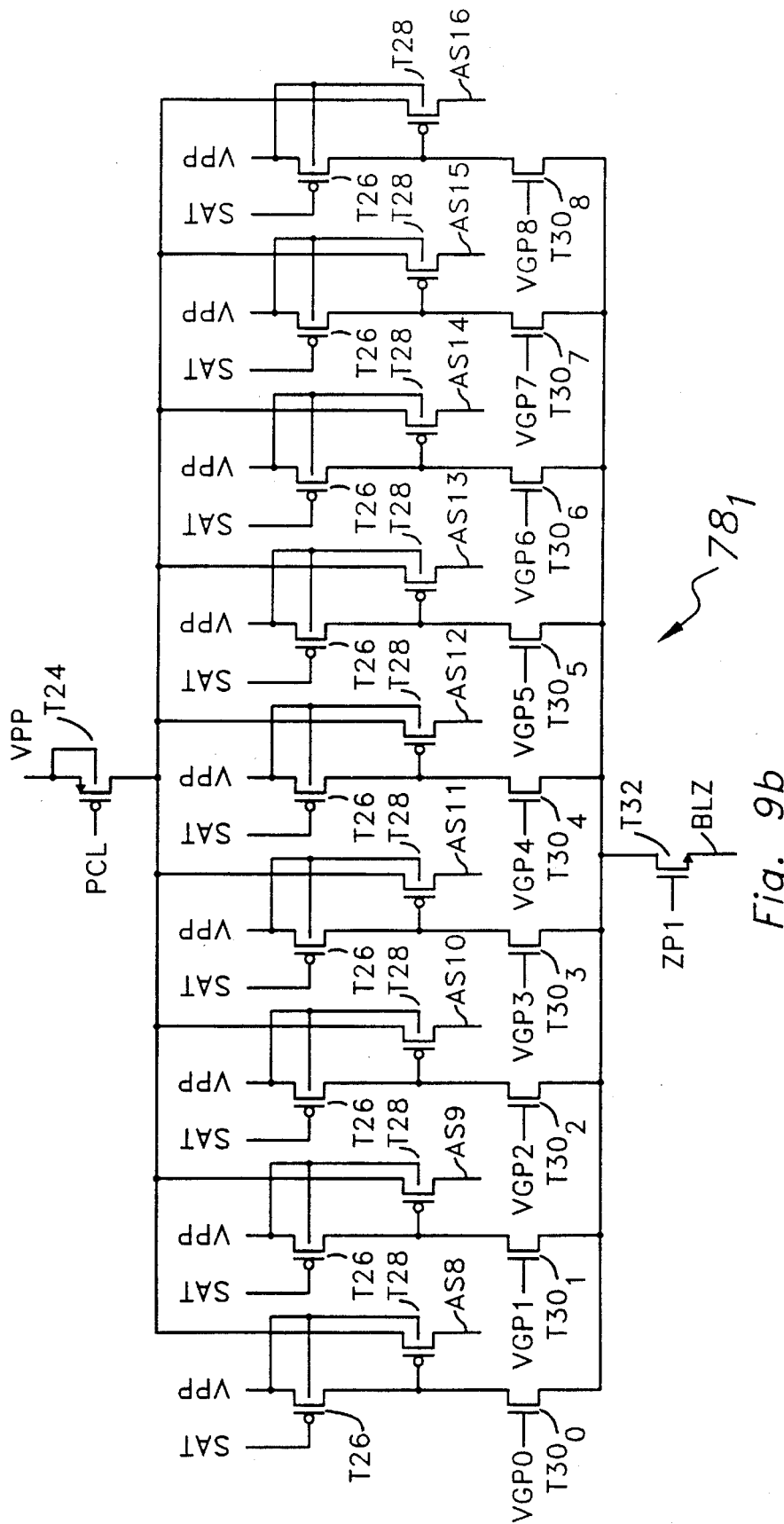
Figure 9C:
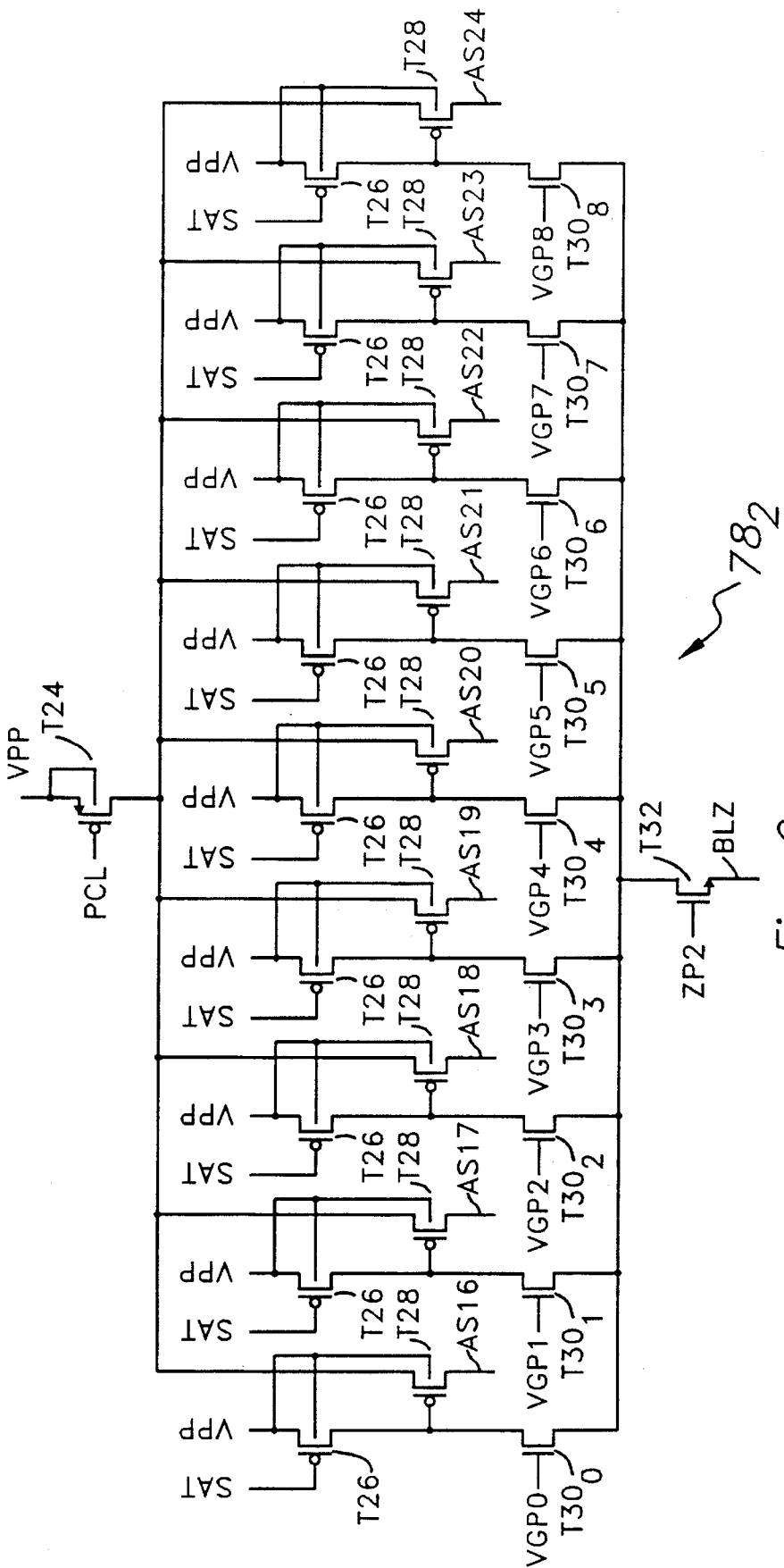
Figure 9D:
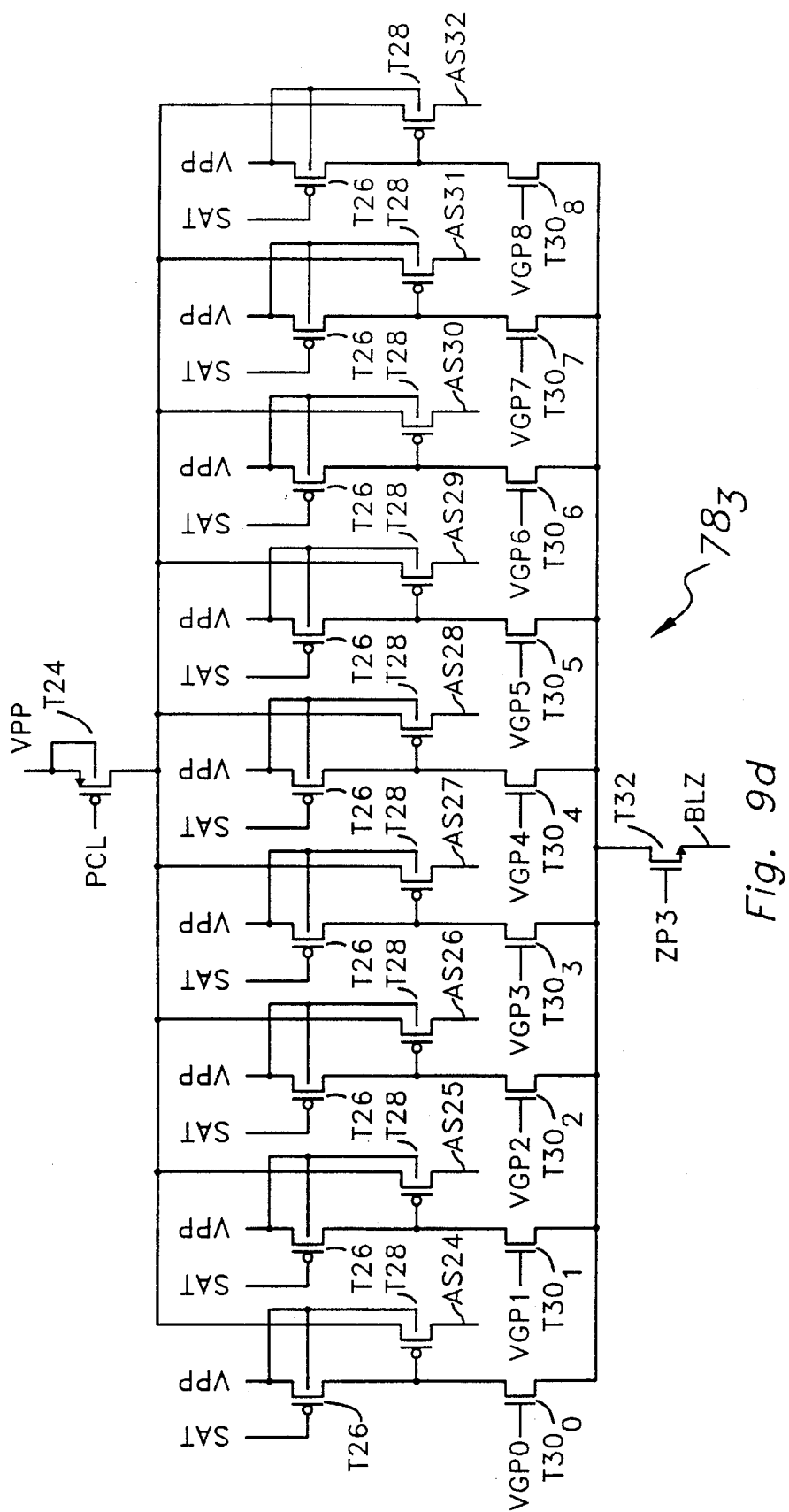

FIGS. 9a–9d are electrical schematic diagrams of source column program circuits $78_0$–$78_3$, respectively. In FIG. 9a, source column lines AS0–AS8 are selectively coupled to p-channel field effect transistor T24 by p-channel field effect transistors T28. Transistor T24 is coupled to programming voltage source Vpp. The gate of transistor T24 receives a signal PCL which limits programming currents applied to a selected source column line AS to an acceptable level. The gates of transistors T28 are coupled between the source-drain current paths of transistors T26 and $T30_0$–$T30_8$. Transistors T26 operate as load devices. The gates of transistors T26 receive a control signal SAT which controls the resistance of transistors T26 such that they operate at low current. The gates of transistors $T30_0$–$T30_8$ receive decoded address signals VGP0–VGP8, respectively. Transistors $T30_0$–$T30_8$ are coupled to transistor T32 which receives decoded address signal ZP0 at its gate.

Figure 10A:
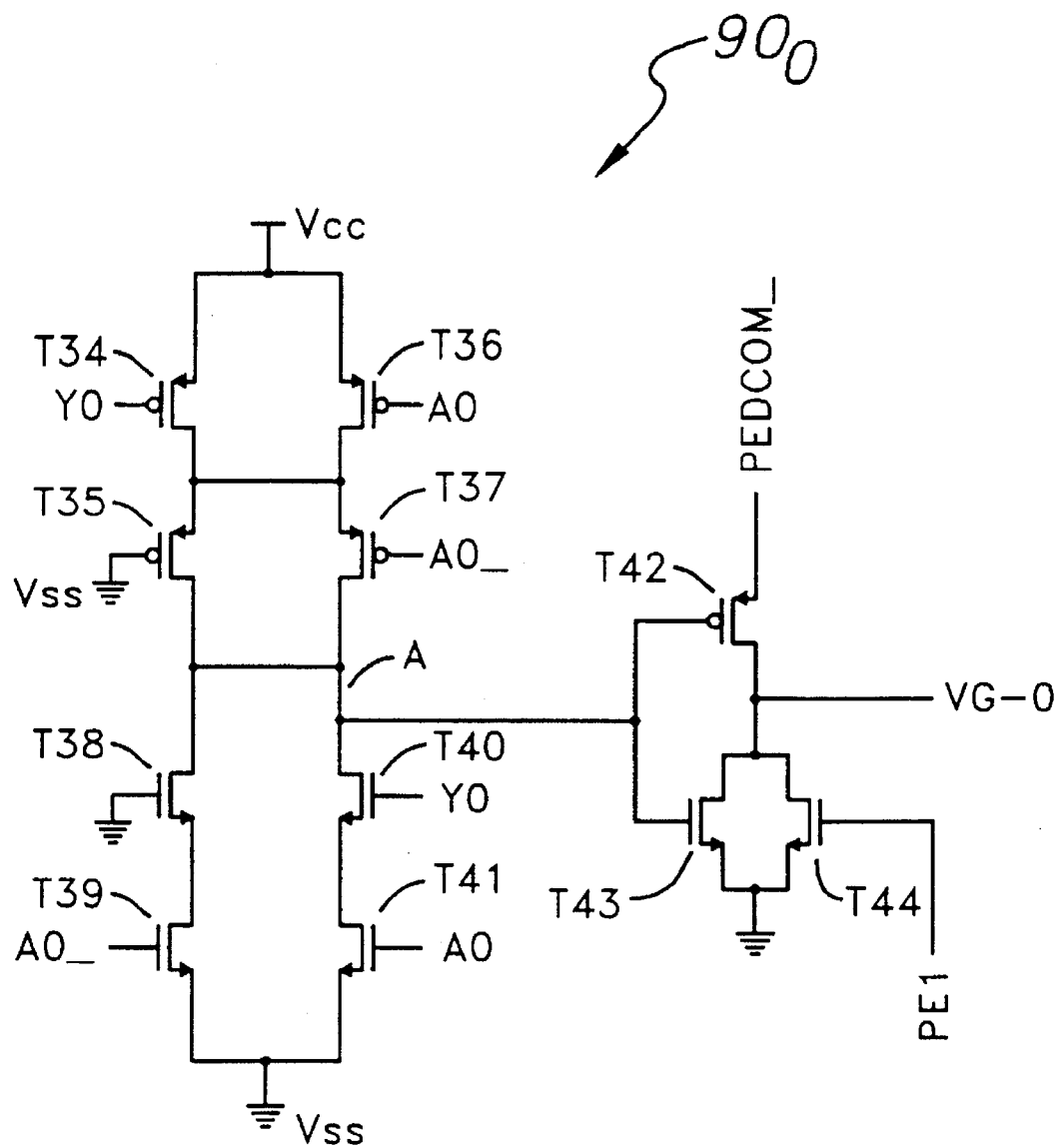
FIGS. 10a–10j are schematic diagrams of first address decoder circuits.
Figure 10B:
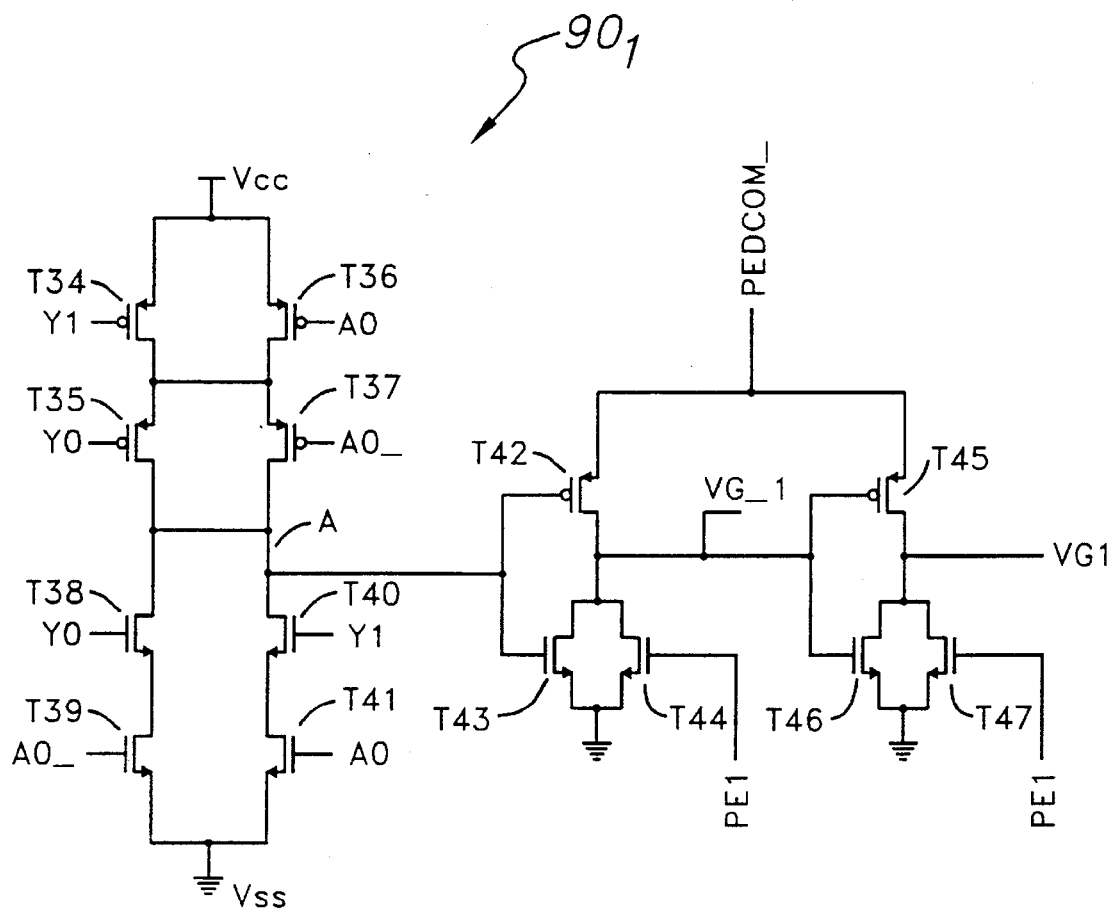
Figure 10C:
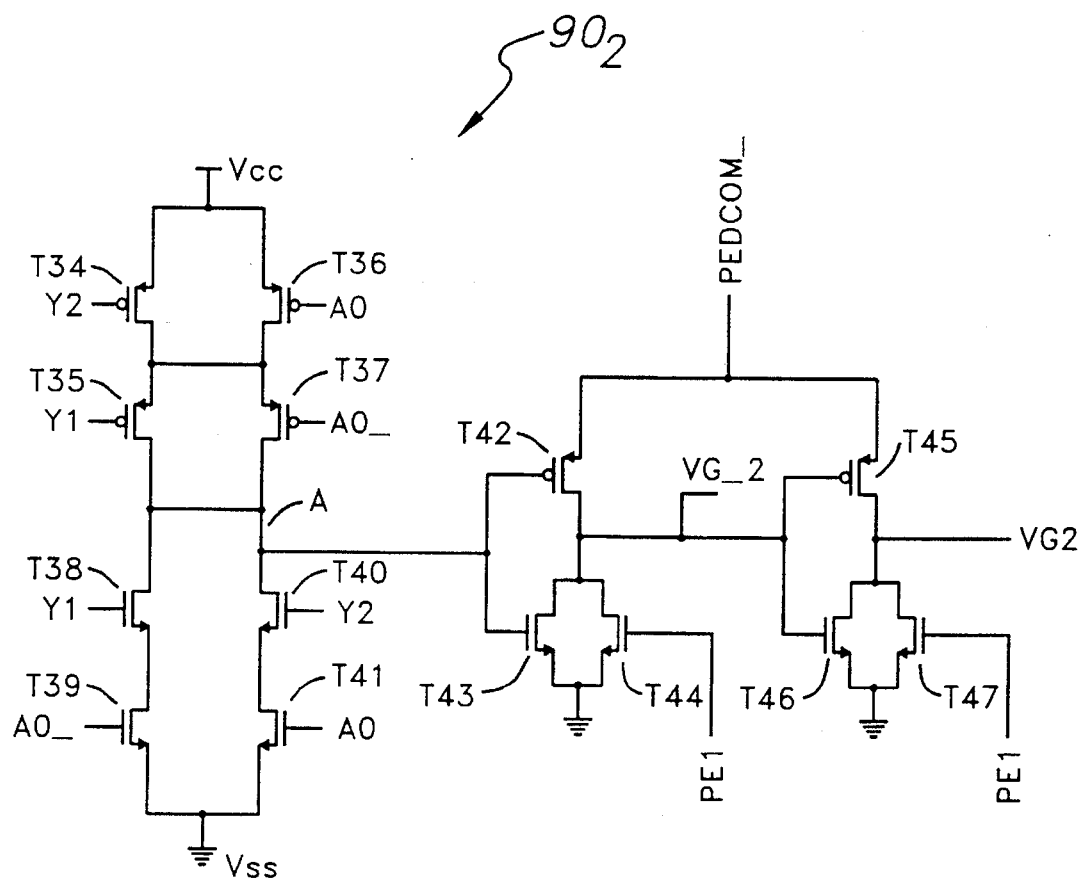
Figure 10D:
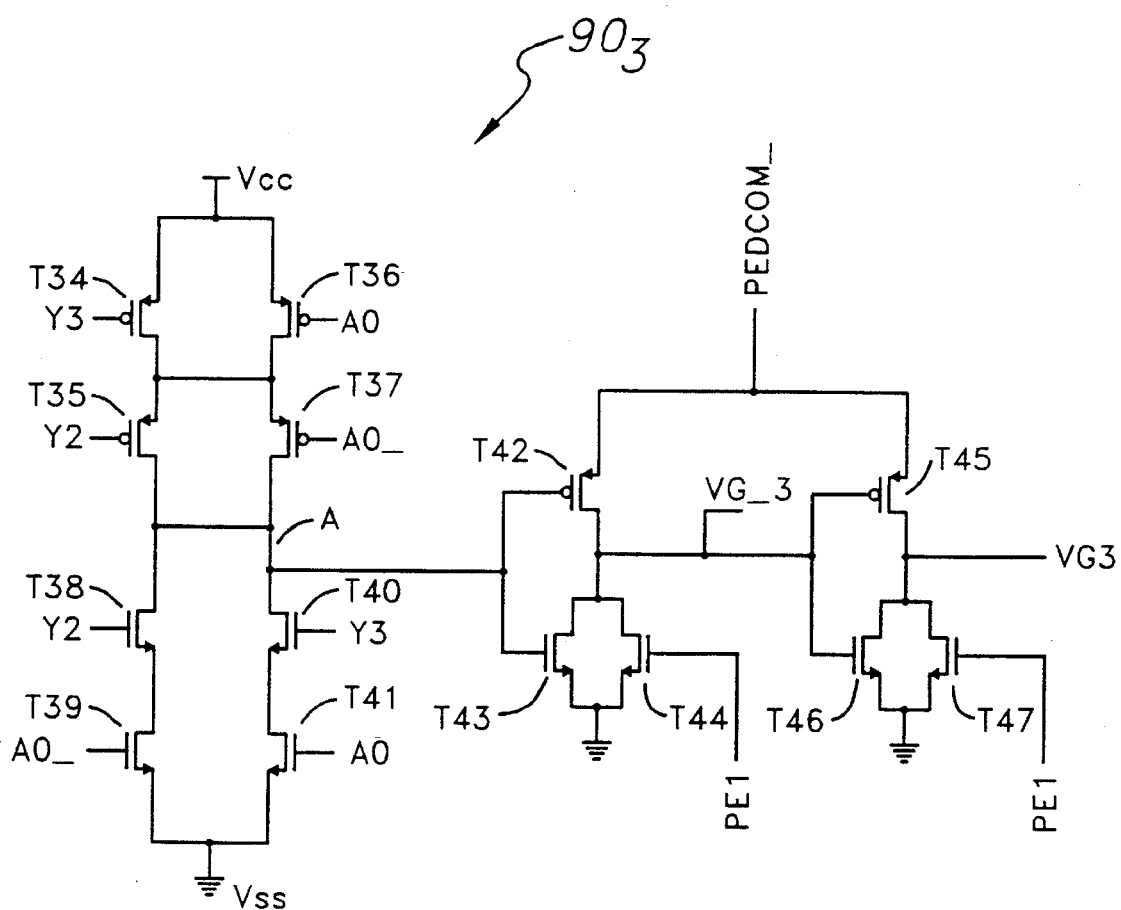
Figure 10E:
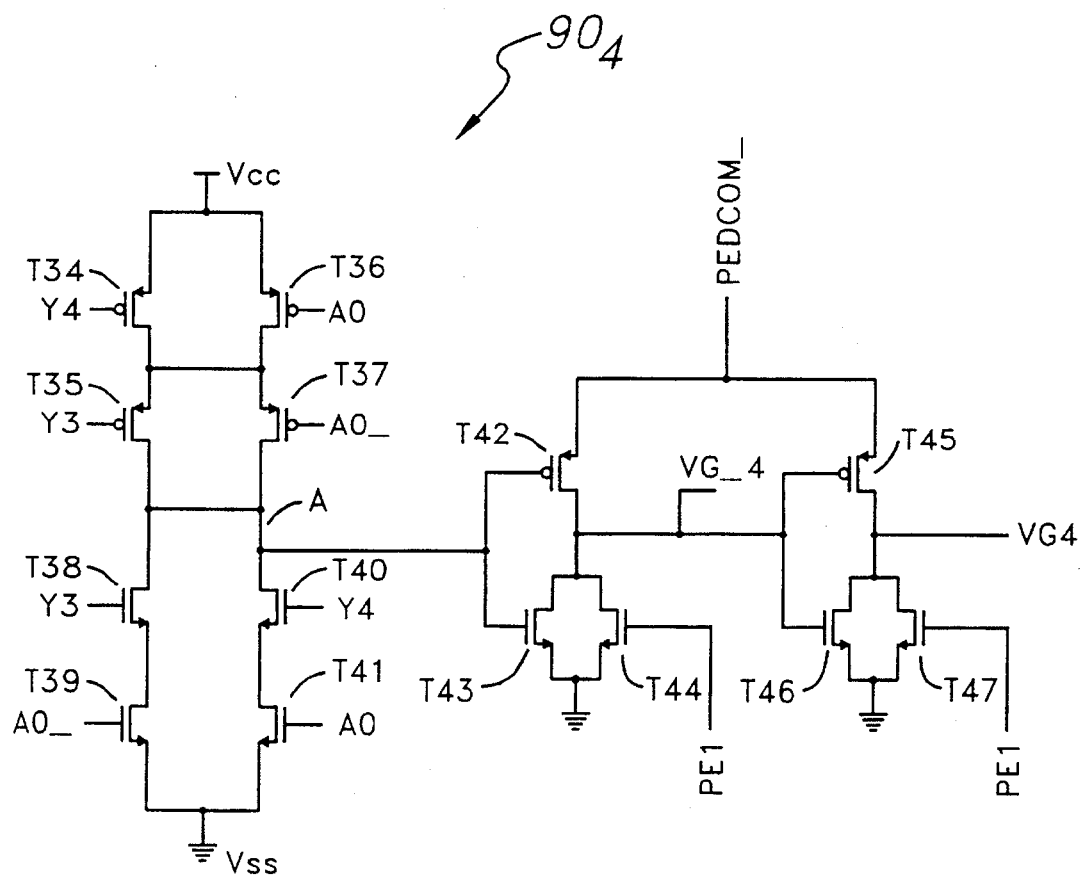
Figure 10F:
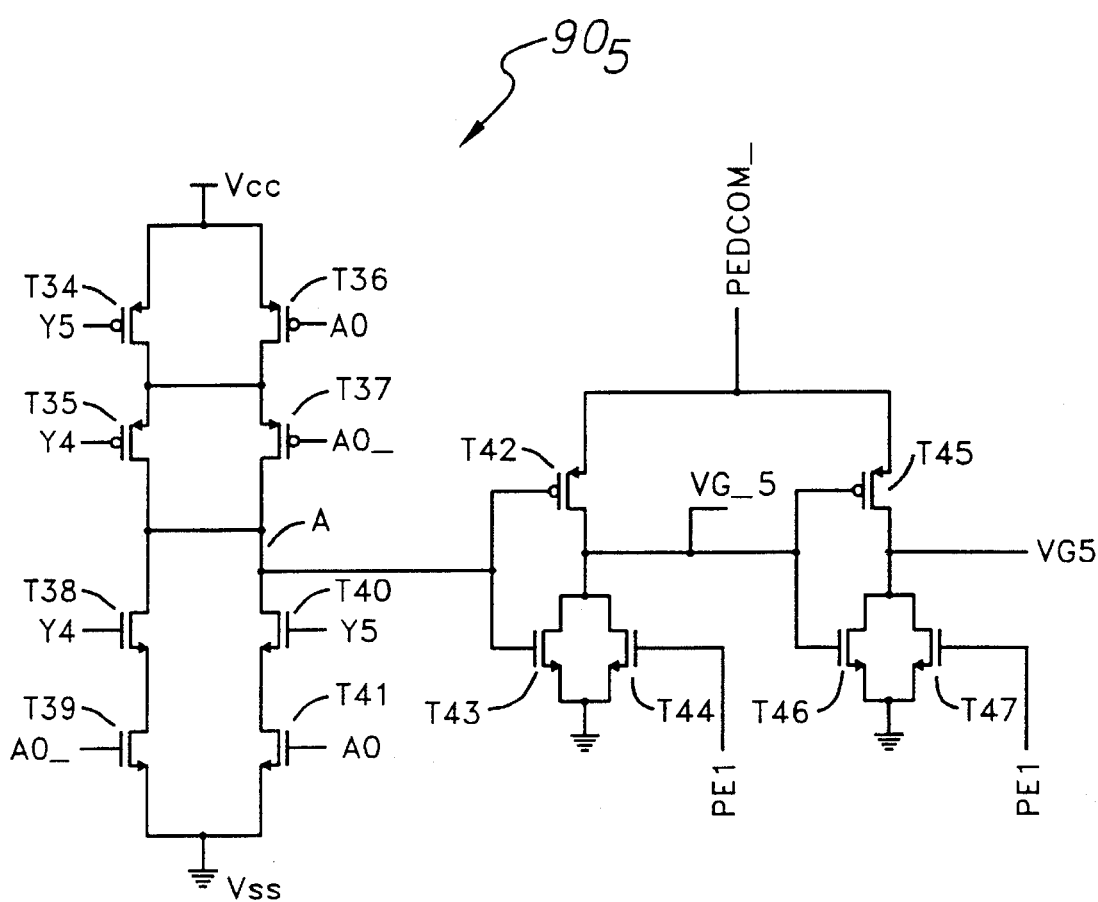
Figure 10G:
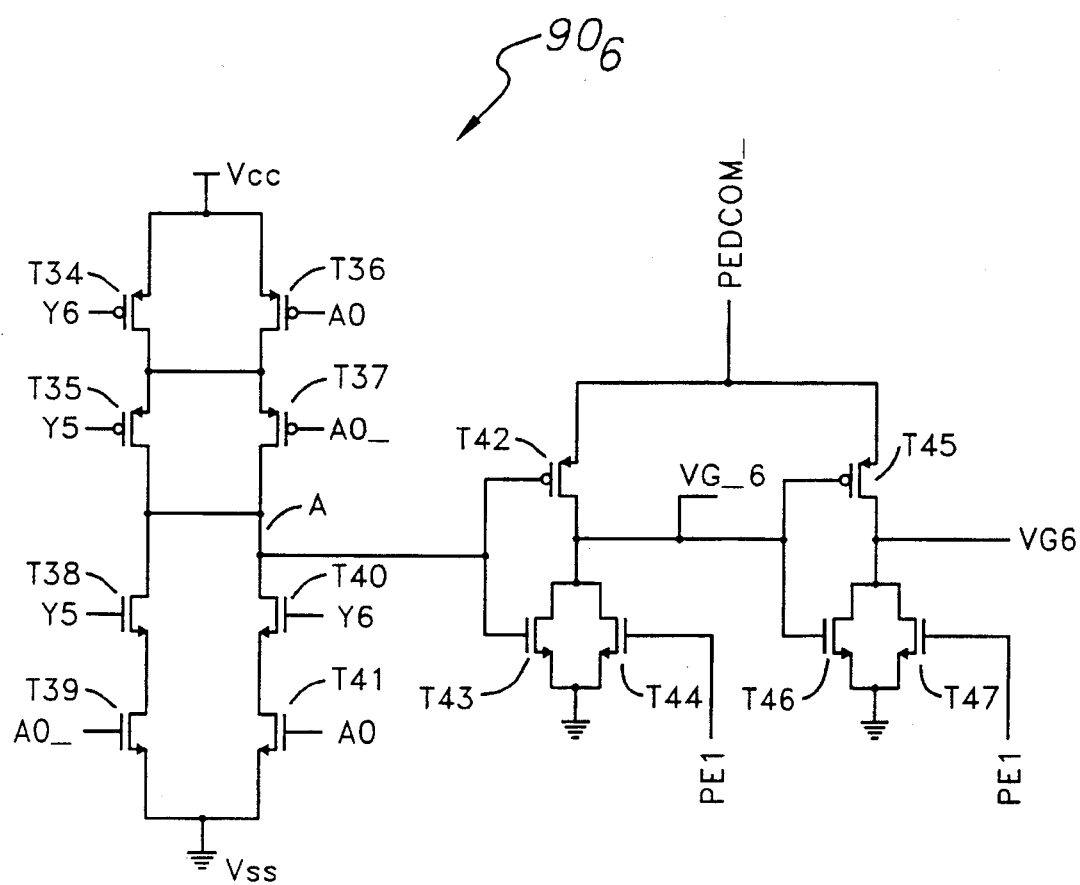
Figure 10H:
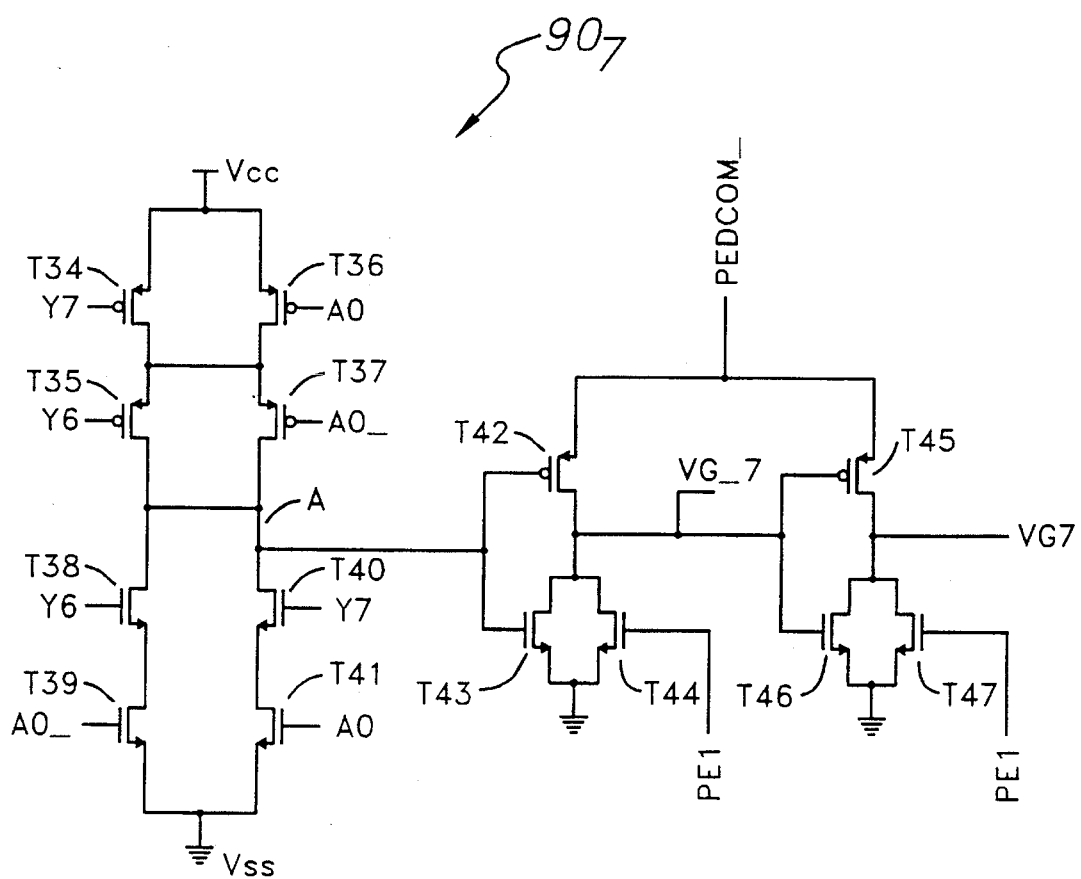
Figure 10I:
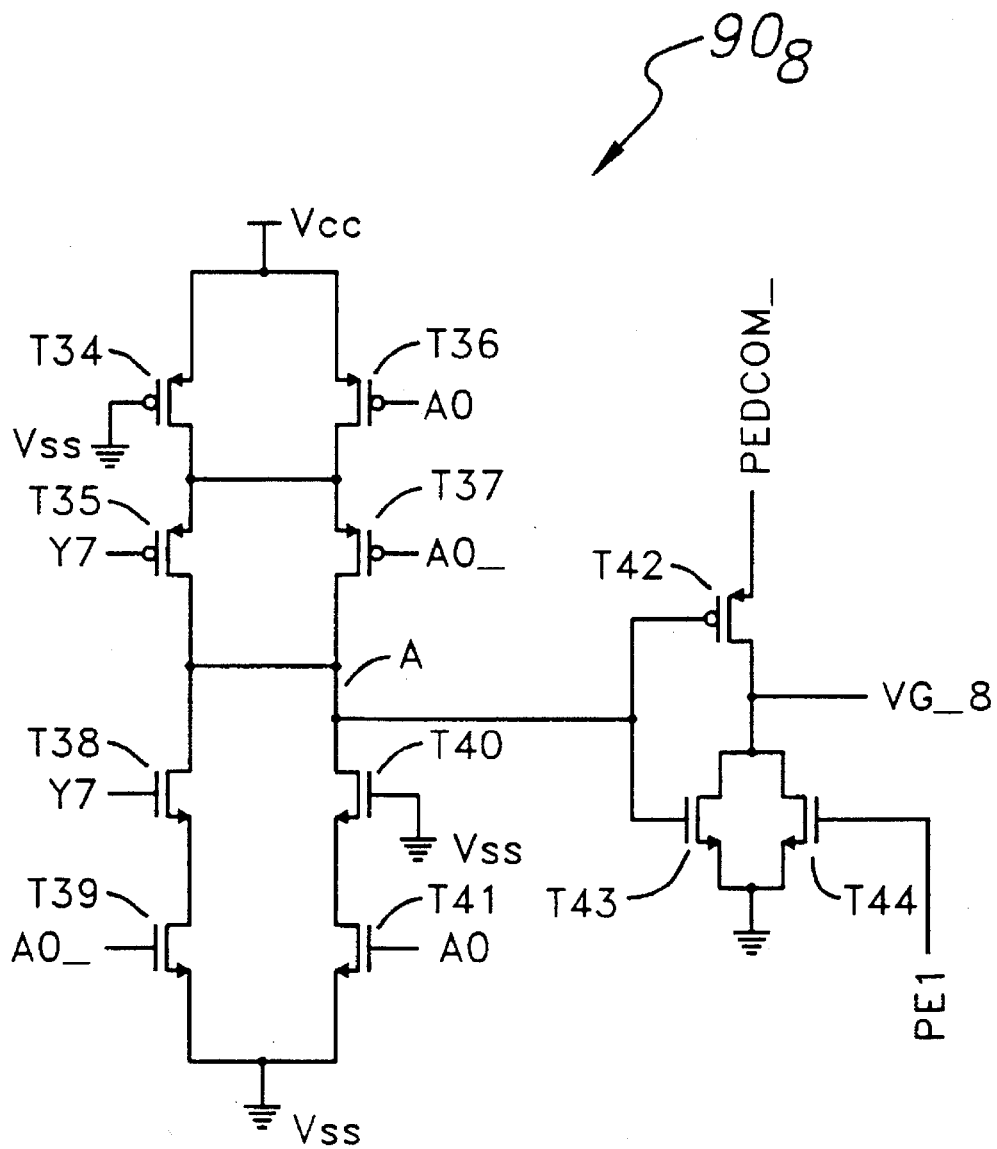
Figure 10J:
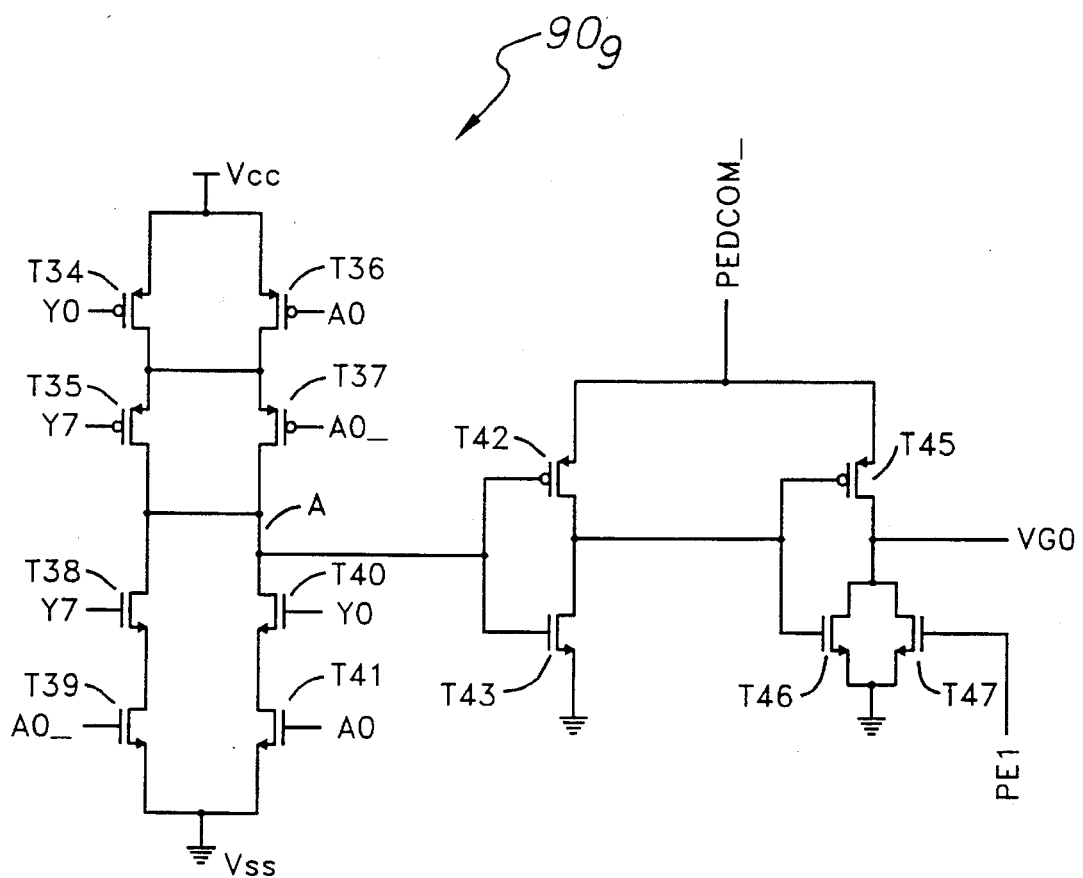

Source column program circuits $78_1$–$78_3$ of FIGS. 10b–10d are identical to column program circuit $78_0$ of FIG. 10a with the source column lines AS0–AS8 replaced with AS8–AS16, AS16–AS24, and AS24–AS32, respectively and signal ZP0 is replaced with signals ZP1, ZP2, and ZP3, respectively.

In the program mode, one of decoded address signals VGP0–VGP8 has a logic "1" value (Vcc) to turn on its associated transistor T30 in each of source column program circuits $78_0$–$78_3$. The remaining signals VGP0–VGP8 have a logic "0" (Vss) value to turn off their associated transistors T30. Transistors T28 coupled to an off transistor T30 are off. One of decoded address signals ZP0–ZP3 also has a logic "1" value to turn on its associated transistor T32. The remaining signals ZP0–ZP3 have a logic "0" to turn off their associated transistors T32. In the program mode therefore, a single transistor T28 in source column program circuits $78_0$–$78_3$ which is associated with the selected source column line AS identified by decoded address signals VGP0–VGP8 and ZP0–ZP3 has its gate coupled to BLZ via an on transistor T30 and an on transistor T32.

When the input data to sense amplifier/program circuit 32 has a logic "1" value, the transistor 28 coupled to BLZ has its gate pulled to Vpp by transistor T26. This occurs because both transistors T30 and T32 are off since the gates of those transistors are at potential Vcc and the sources of those transistors are at a potential no lower than Vcc. In this instance, transistor 28 associated with the selected source column line AS is off.

When the input data to sense amplifier/program circuit 32 has a logic "0" value, the transistor T28 coupled to BLZ has its gate pulled low to Vss because its associated transistor T26 is in a resistive state via the SAT signal. When its gate is low, transistor T28 supplies programming voltage Vrw to its associated source column line AS to permit a selected cell to be programmed to a "0" value.

FIGS. 10a–10j show address decoding circuits 900–909, respectively, for producing decoded address signals VG0–VG7 and VG_0–VG_8 which are applied to source column read block circuit 70 of FIG. 3. Decoding circuits $90_0$–$90_8$ include transistors T34–T44 which produce signals VG_0–VG_8. Decoding circuits $90_1$–$90_7$ also include transistors T45–T47 which produce signals VG1–VG7. Decoding circuit $90_9$ includes transistors T34–T43 and T45–T47 which produce signal VG0. Transistors T34, T35, T38, and T40 receive signals Y0–Y7 from 1 of 8 decoder 73 in FIG. 6 or are coupled to Vss or ground. Transistors T36, T37, T39, and T41 receive address signal A0 or its complement A0_. In the program mode, signal PEDCOM_ has a logic "0" value and signal PE1 has a logic "1" value to turn on transistors T44 and T47 to drive signals VG_0–VG_8 and VG0–VG7 low. In the read mode, signal PEDCOM_ has a logic "1" value and signal PE1 has a logic "0" value to turn transistors T44 and T47 off. Node A is driven to Vcc when either T34 and T37 are on or T35 and T36 are on. This turns T42 off and T43 on driving VG to Vss or logic "0" value. This, in turn, turns T45 on and T46 off driving VG to PEDCOM_ or logic "1" value. Node A is driven to Vss or ground when either T38 and T39 are on or T40 and T41 are on. This turns T42 on and T43 off driving VG_ to PEDCOM_ or logic "1" value. This, in turn, turns T45 off and T46 on driving VG to Vss or logic "0" value. For example, if column 0 and therefore source column line AS0 has been selected, A0–A3 has the value 0000. A0 is "0", A_0 is "1" Y0 is 1 and, in FIG. 10a, transistors T35 and T36 are on and T39 and T40 are off to drive node A to Vcc. This turns T43 on driving VG_0 to Vss or logic "0" value.

Figure 11:
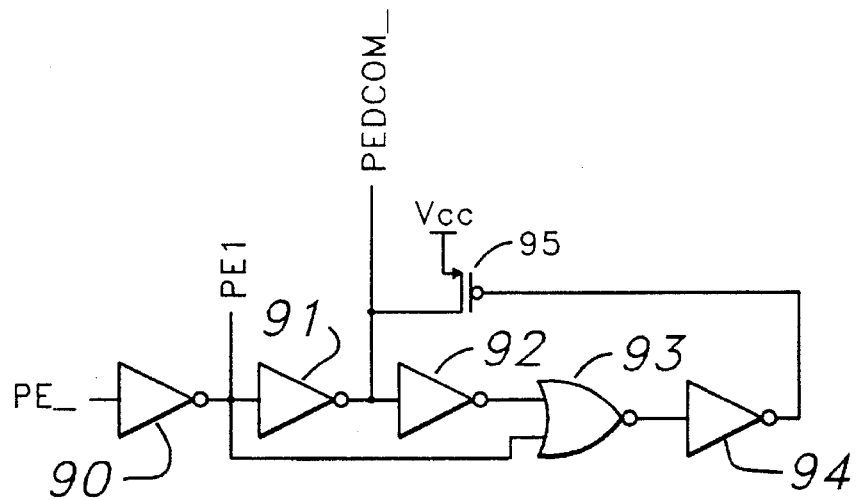
FIG. 11 is a schematic diagram of a circuit for producing control signals for the decoder circuits of FIGS. 10a–10j.

FIG. 11 shows a circuit for producing signals PE1 and PEDCOM_. In the program mode, signal PE_ has a logic "0" value, signal PE1 produced by inverter 90 has a logic "1" value, and signal PEDCOM_ is produced by inverter 91 having a logic "0" value. In the read mode, signal PE_ has a logic "1" value, signal PE1 produced by inverter 90 has a logic "0" value, and signal PEDCOM_ is produced by inverter 91 having a logic "1" value.

Figure 12:
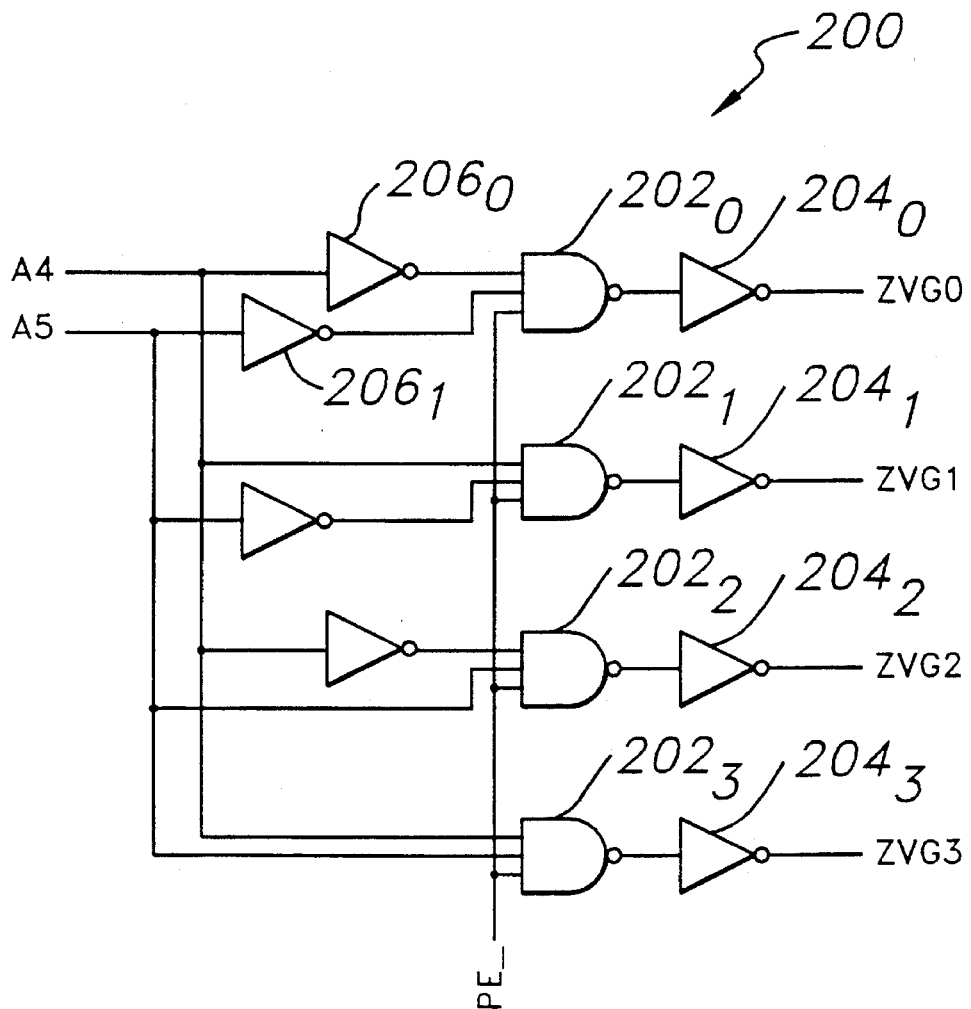
FIG. 12 is a schematic diagram of a second address decoder circuit.
Figure 13B:
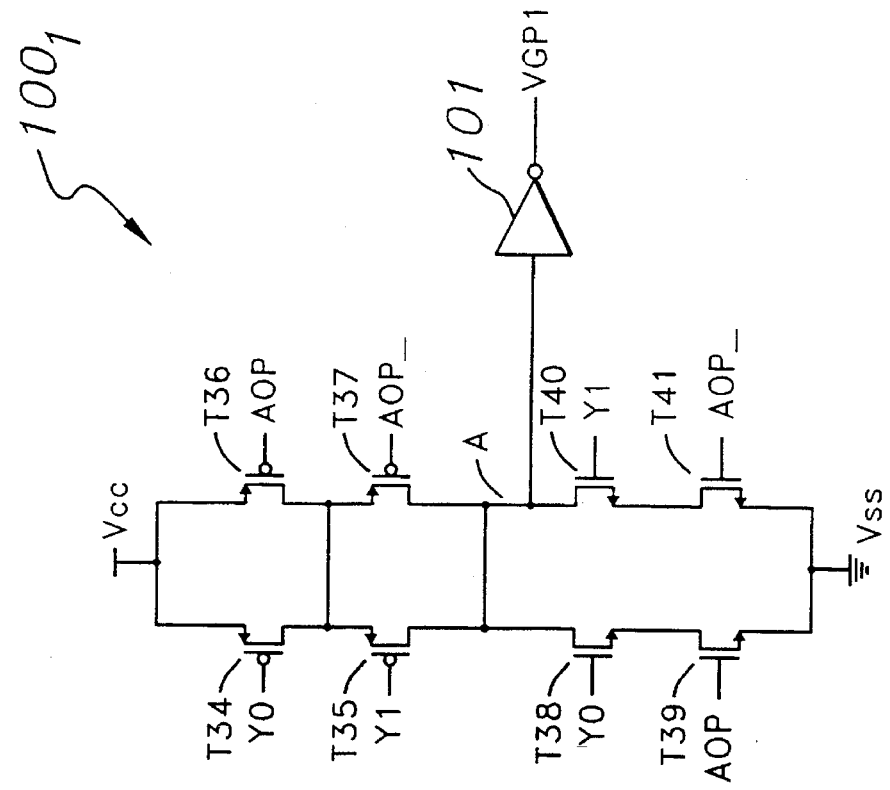
FIGS. 13a–13i are schematic diagrams of third address decoder circuits.
Figure 13A:
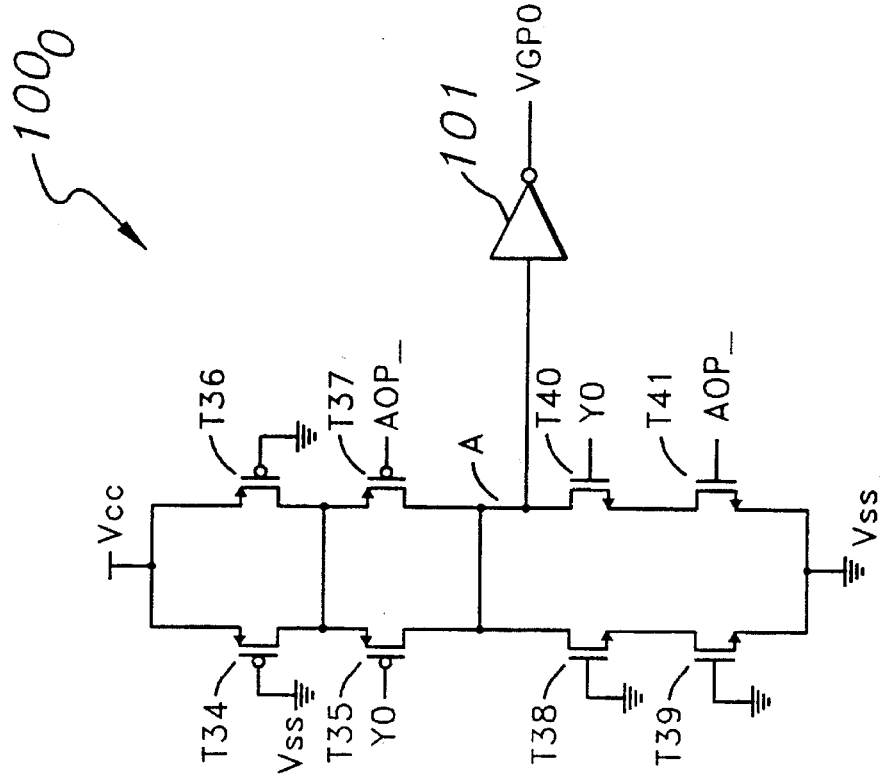
Figure 13D:
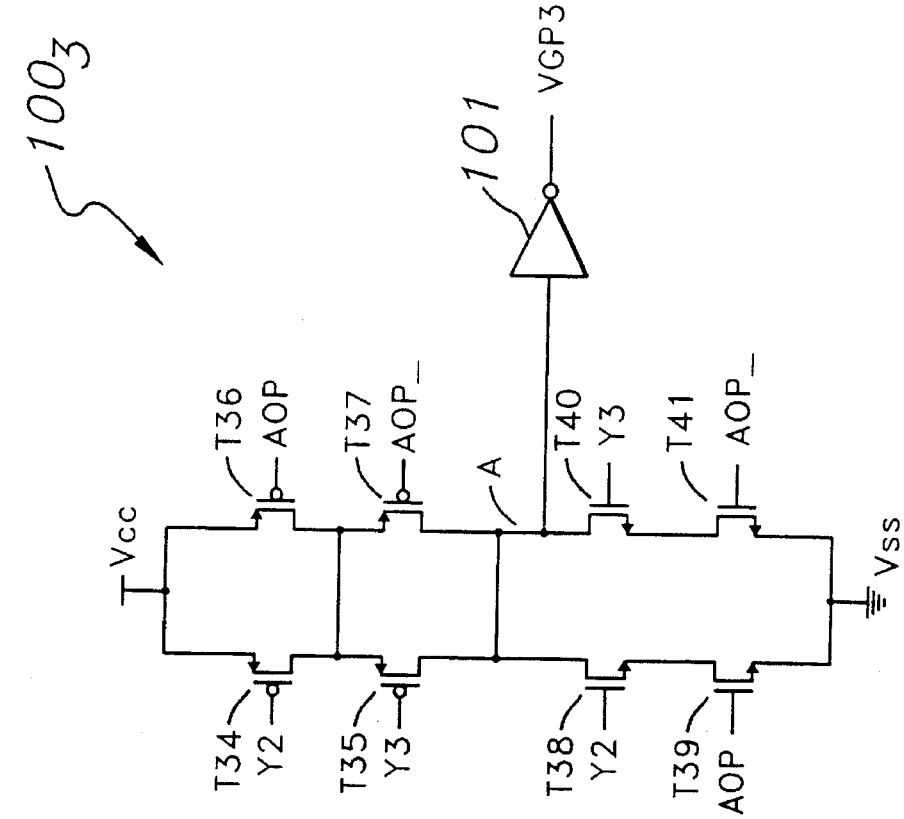
Figure 13C:
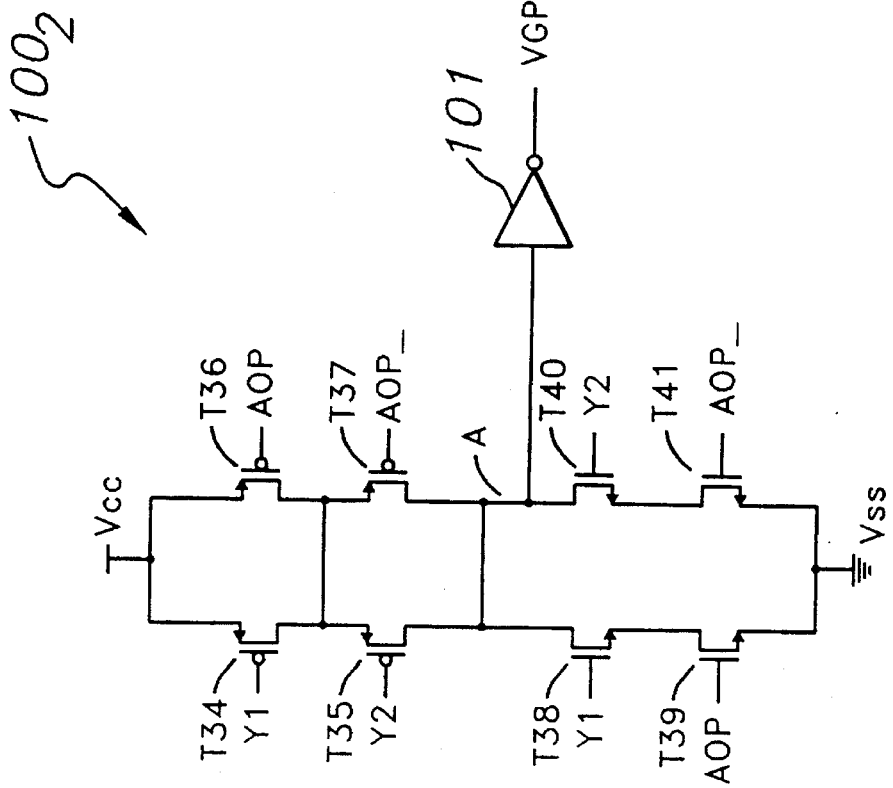
Figure 13F:
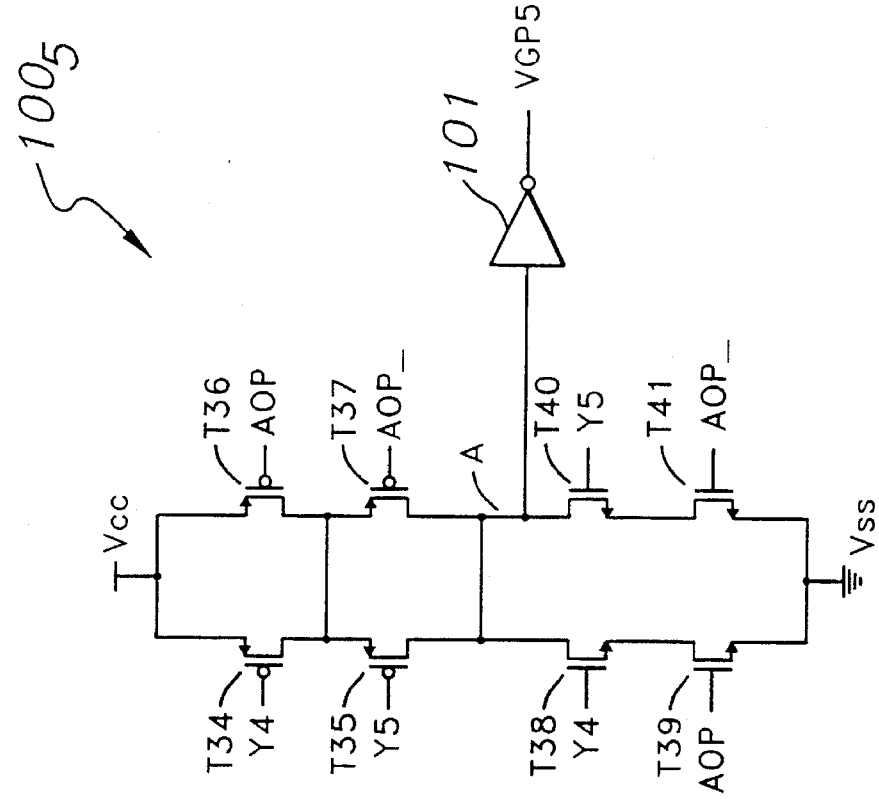
Figure 13E:
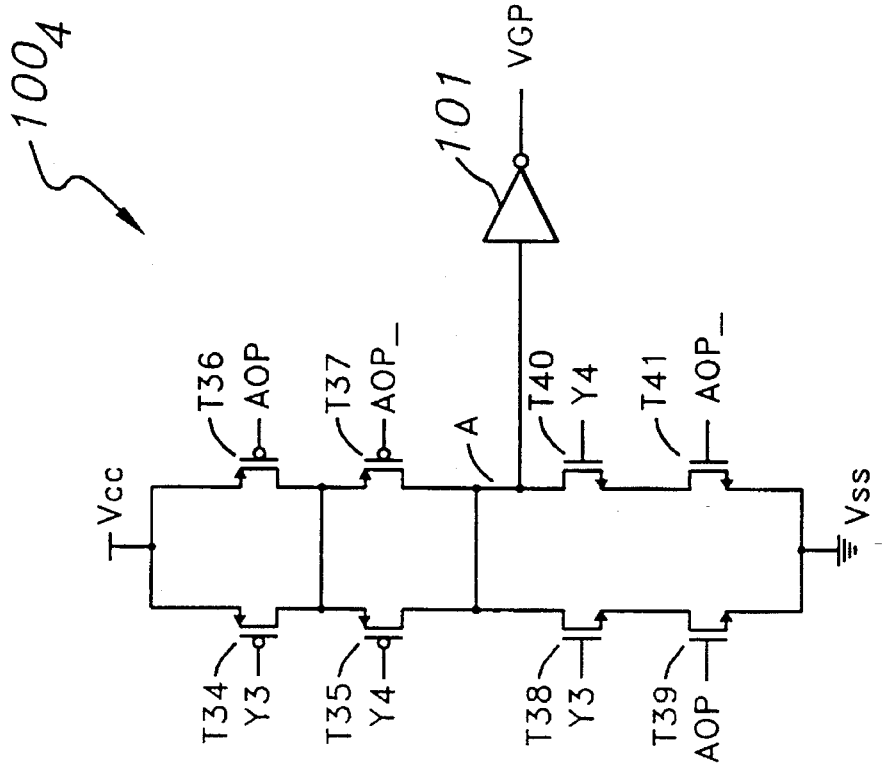
Figure 13H:
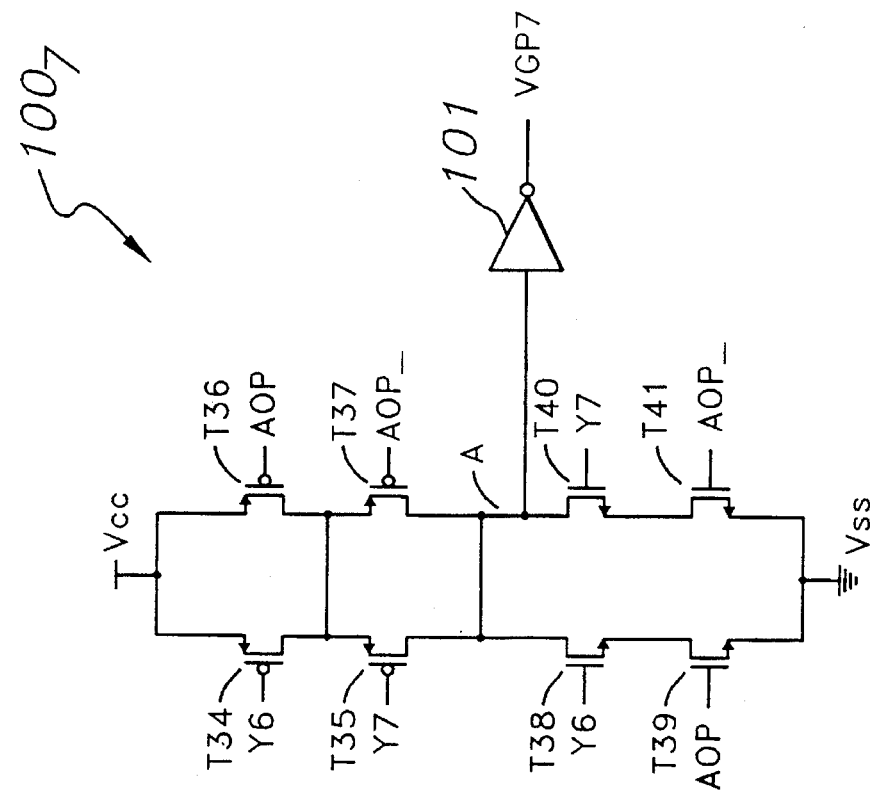
Figure 13G:
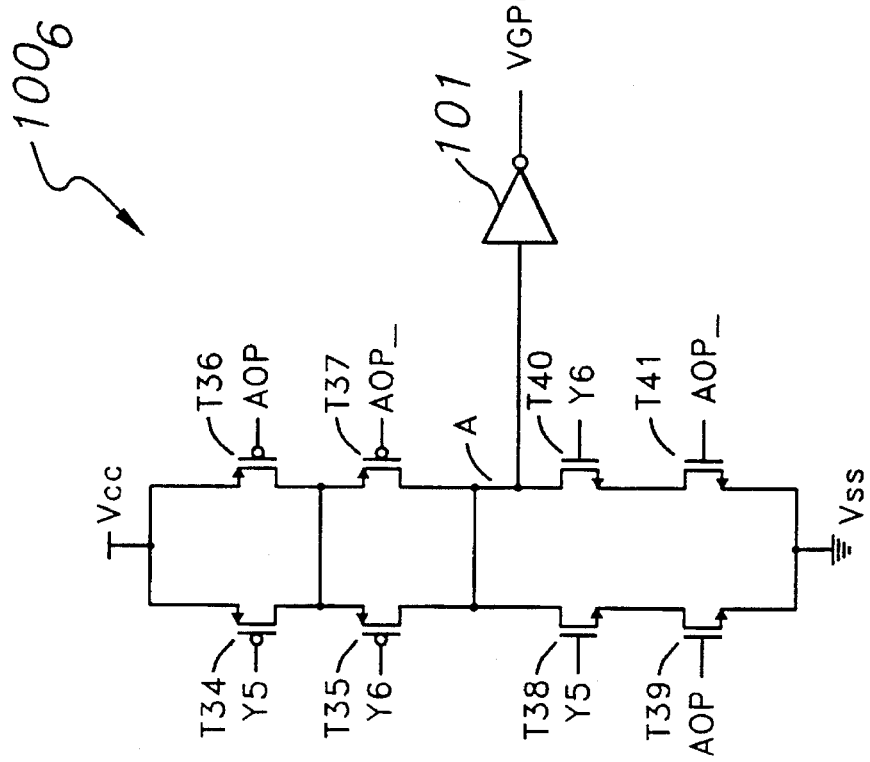

FIG. 12 shows an address decoding circuit 200 for producing decoded address ZVG0–ZVG3 in response to address signals A4 and A5 and signal PE_. In the program mode, PE_ has a logic "0" value causing ZVG0–ZVG3 to have logic "0" values irrespective of the values of A4 and A5. In the read mode, PE_ has a logic "1" value to permit NAND gates 2020–2023 to determine ZVG0–ZVG3 in response to the values of A4 and A5. For example, if A4 and A5 have "0" values, the outputs of inverters $206_0$ and $206_1$ will have "1" values, the output of NAND gate $202_0$ will have a "0" value and the output of inverter $204_0$, ZVG0, will have a "1" value.

FIGS. 13a–13i show address decoding circuits $100_0$–$100_8$, respectively, for producing decoded address signals VGP0–VG8 which are applied to source column program block circuit 78 of FIG. 3. Decoding circuits $100_0$–$100_8$ include transistors T34–T41 which operate in the same manner as transistors T34–T41 in FIGS. 11a–11j to control the potential at node A. Inverter 101 produces signals VGP0–VGP8 having a logic "1" value when node A is driven to Vss and a logic "0" value when node A is driven to Vcc.

Figure 14:
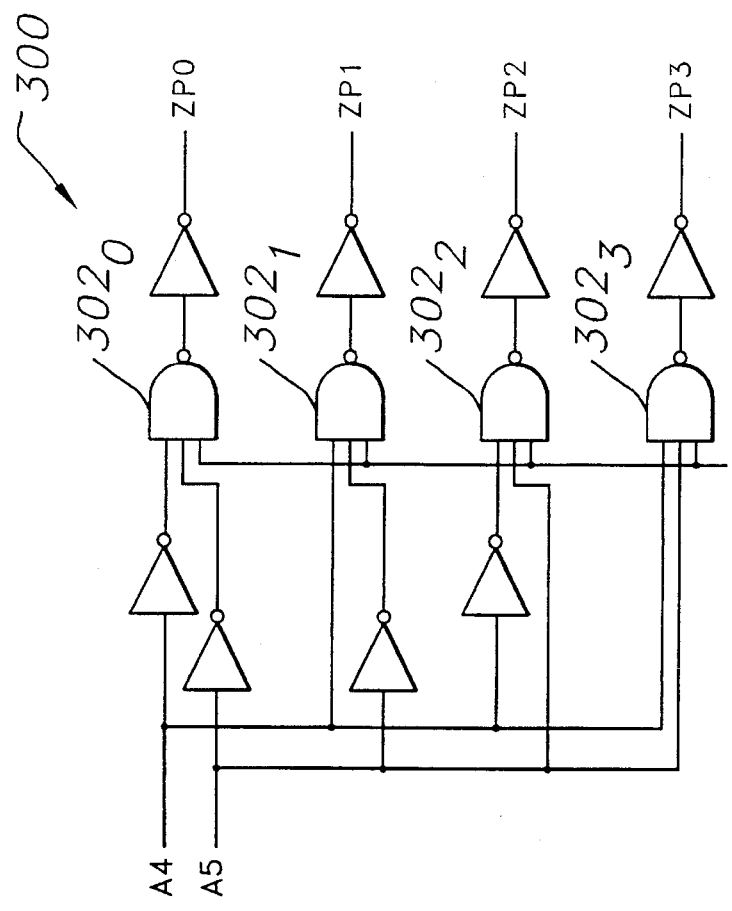
FIG. 14 is a schematic diagram of a fourth address decoder circuit.

FIG. 14 shows an address decoding circuit 300 for producing decoded address ZP0–ZP3 in response to address signals A4 and A5 and signal PE. In the read mode, PE has a logic "0" value causing ZP0–ZP3 to have logic "0" values irrespective of the values of A4 and A5. In the program mode, PE has a logic "1" value to permit NAND gates $302_0$–$302_3$ to determine ZP0–ZP3 in response to the values of A4 and A5.

Figure 15:
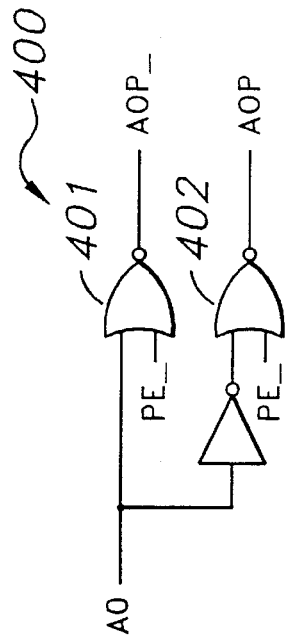
FIG. 15 is a schematic diagram of a circuit for producing address signals supplied to the decoder circuits of FIGS. 13a–13i.
Figure 13I:
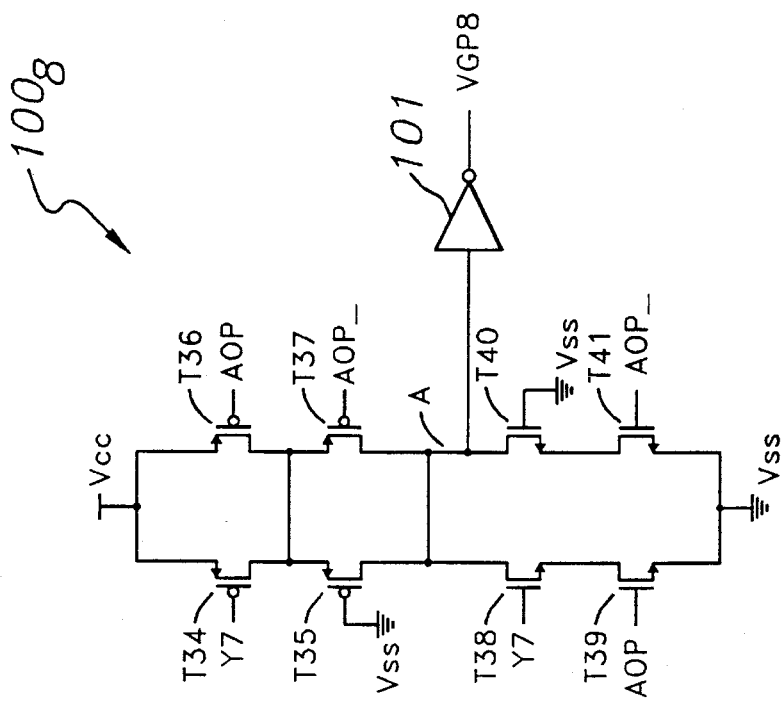

FIG. 15 shows a circuit 400 for producing signals A0P and A0P_ supplied to decoding circuits $100_0$–$100_8$ in FIGS. 13a–13h. Signal PE_ is a logic 1 value in the read mode causing signals A0P_ and A0P produced by NOR gates 401 and 402 to have logic 0 values irrespective of the value of A0. In the program mode, PE_ is a logic 0 value causing signals A0P_ and A0P to have the same value as A0.

A preferred embodiment has been described in detail hereinabove. It is to be understood that the scope of the invention also comprehends embodiments different from that described, yet within the scope of the claims.

For example, the column decoding circuitry may be used in memory devices other than EPROMs. The column decoding circuitry may also be used to decode array portions in which the positions of the source column lines and drain column lines are interchanged resulting in n source column lines and n+1 drain column lines.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory device, comprising:

an array of rows and columns of memory cells;

a plurality of alternating first and second column lines, a column of cells coupled between each pair of adjacent column lines, the cells in each column being coupled to a first column line and a second column line;

a first decoder for selecting a plurality of first column lines in response to first decoded address signals and selecting one of said selected plurality of first column lines in response to second decoded address signals.

2. The memory device of claim 1 in which said first column lines are source column lines and said first decoder couples the selected one of said source column lines to a driver circuit in a read mode.

3. The memory device of claim 1 in which said first column lines are source column lines and said first decoder couples the selected one of said source column lines to a source of programming voltage in a programming mode in response to input data of a predetermined value.

4. The memory device of claim 1 in which said first column lines are drain column lines and said first decoder couples the selected one of said drain column lines to a bias circuit in a read mode and to a source of input data in a programming mode.

5. The memory device of claim 1 further comprising:
a second decoder for selecting a plurality of first column lines in response to third decoded address signals and selecting one of said selected plurality of first column lines in response to fourth decoded address signals.

6. The memory device of claim 5 further comprising:
a third decoder for selecting a plurality of second column lines in response to fifth decoded address signals and selecting one of said selected plurality of first column lines in response to sixth decoded address signals.

7. A method for programming a memory device having an array of rows and columns of memory cells, a plurality of alternating first and second column lines, with a column of cells between each pair of adjacent column lines and with the cells in each column being coupled to a first column line and a second column line, comprising the steps of:

selecting a plurality of first column lines in response to first decoded address signals; and selecting one of said selected plurality of first column lines in response to second decoded address signals.

8. The method of claim 7 in which said first column lines are source column lines further comprising the step of coupling the selected one of said source column lines to a driver circuit.

9. The method of claim 7 in which said first column lines are source column lines further comprising the step of coupling the selected one of said source column lines to a source of programming voltage.

10. The method of claim 7 in which said first column lines are drain column lines further comprising the step of coupling the selected one of said drain column lines to a bias circuit.

11. The memory device of claim 5, in which said first, second, third, and fourth decoded address signals are produced when said memory device is operating in a read mode.

12. The memory device of claim 6, in which said third, fourth, fifth, and sixth decoded address signals are produced when said memory device is operating in a program mode.

* * * * *